(12) United States Patent
Nakayama

(10) Patent No.: US 8,770,727 B2
(45) Date of Patent: Jul. 8, 2014

(54) PIEZOELECTRIC ELEMENT, PIEZOELECTRIC ACTUATOR, LIQUID EJECTING HEAD AND LIQUID EJECTING APPARATUS

(75) Inventor: Masao Nakayama, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 198 days.

(21) Appl. No.: 13/176,101

(22) Filed: Jul. 5, 2011

(65) Prior Publication Data

US 2012/0007927 A1    Jan. 12, 2012

(30) Foreign Application Priority Data

Jul. 8, 2010   (JP) .................. 2010-156018
Mar. 18, 2011  (JP) .................. 2011-060616

(51) Int. Cl.
*B41J 2/045*    (2006.01)

(52) U.S. Cl.
USPC ............... 347/71; 347/68; 347/70; 347/72

(58) Field of Classification Search
USPC .................................................. 347/68–72
See application file for complete search history.

(56) References Cited

U.S. PATENT DOCUMENTS

| 2008/0231146 A1* | 9/2008 | Izumi et al. | 310/358 |
| 2009/0284568 A1* | 11/2009 | Yazaki | 347/68 |
| 2011/0043575 A1* | 2/2011 | Nakayama | 347/68 |

FOREIGN PATENT DOCUMENTS

JP    2009-172878    8/2009

* cited by examiner

*Primary Examiner* — Henok Legesse
(74) *Attorney, Agent, or Firm* — Workman Nydegger

(57) ABSTRACT

A piezoelectric element includes a first electrode, a first piezoelectric layer which is formed at an upper side of the first electrode and at lateral sides to the first electrode, a porous layer which is formed so as to cover side surfaces of the first piezoelectric layer, and a second electrode which is formed at an upper side of the first piezoelectric layer and the porous layer. In the piezoelectric element, the porous layer contains at least one metal element constituting the first piezoelectric layer.

19 Claims, 20 Drawing Sheets

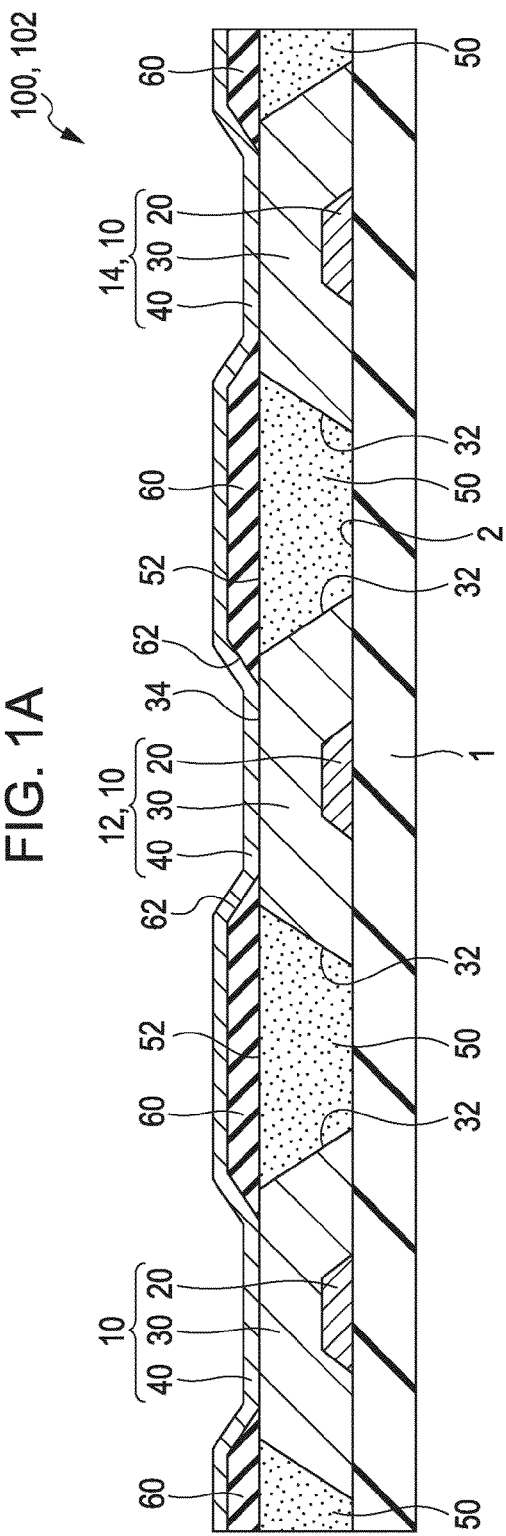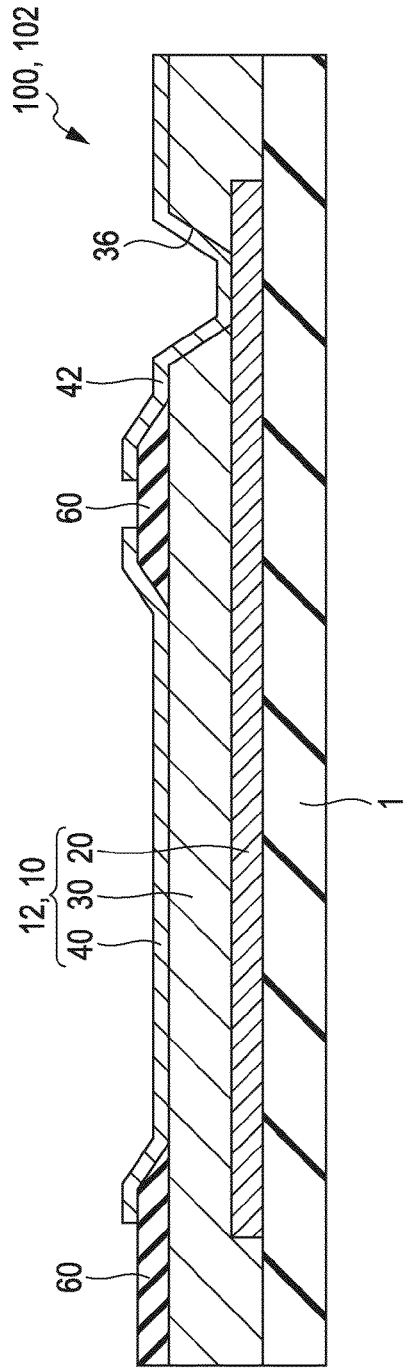

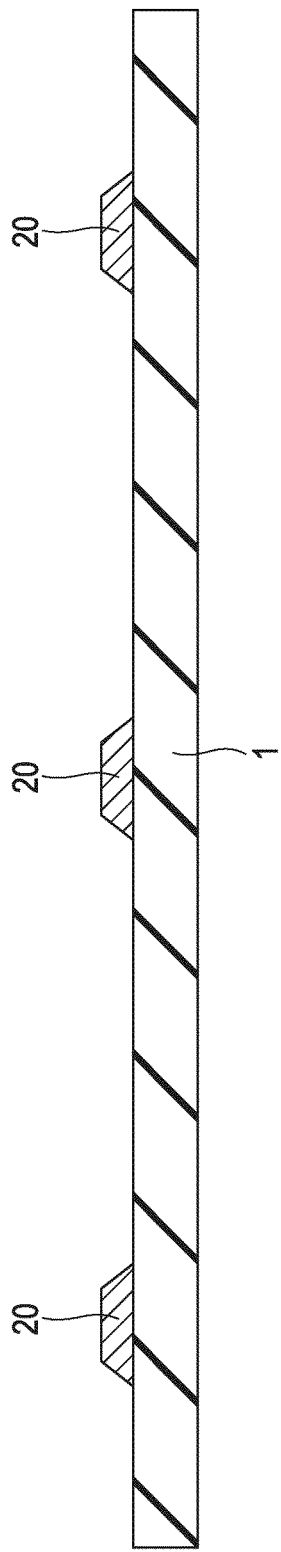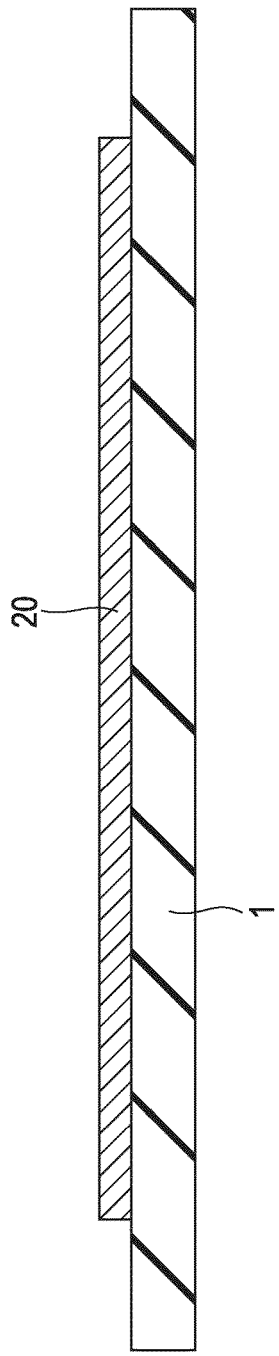

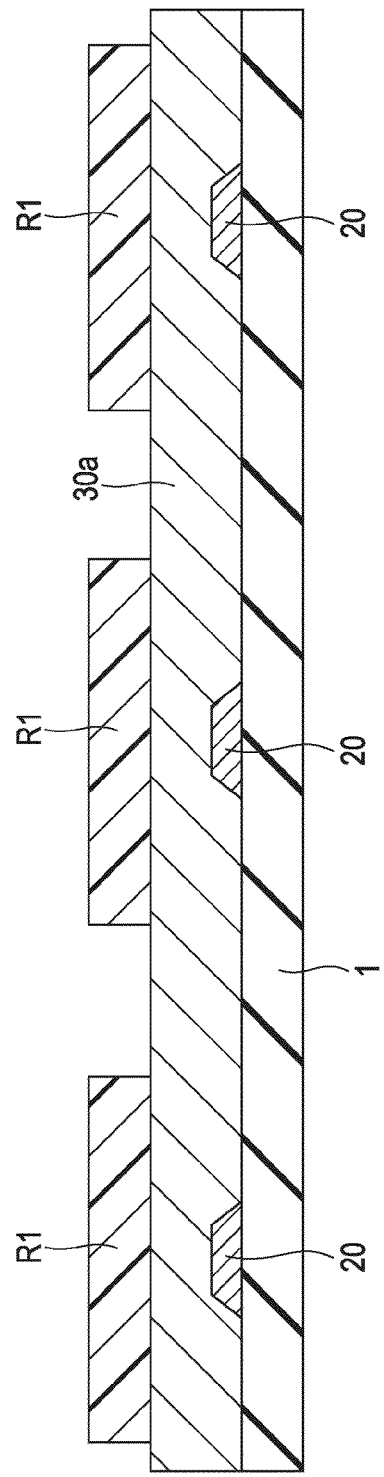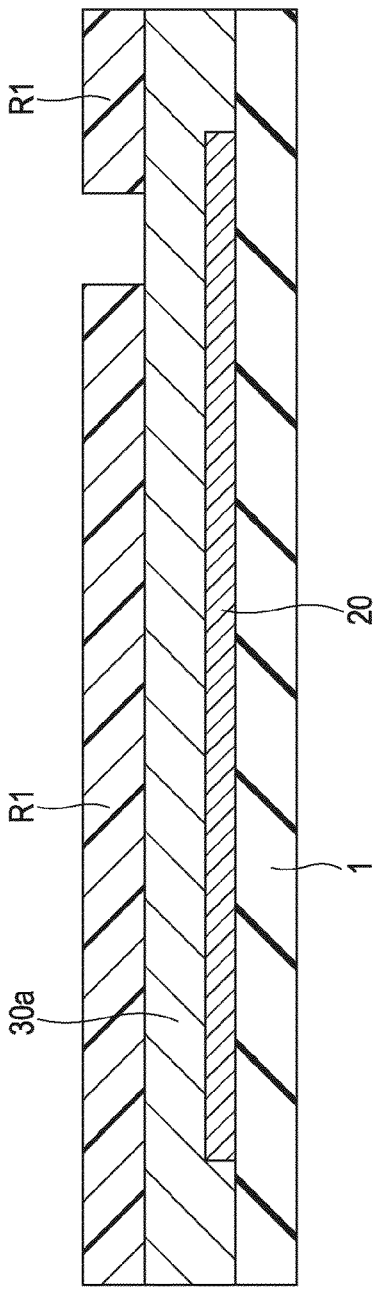

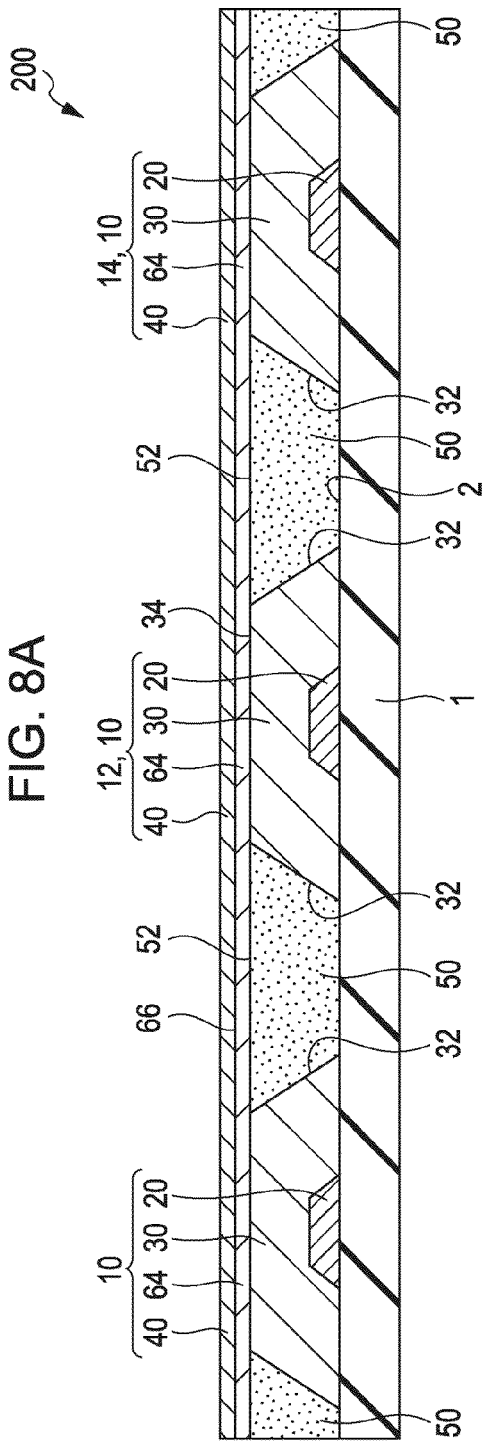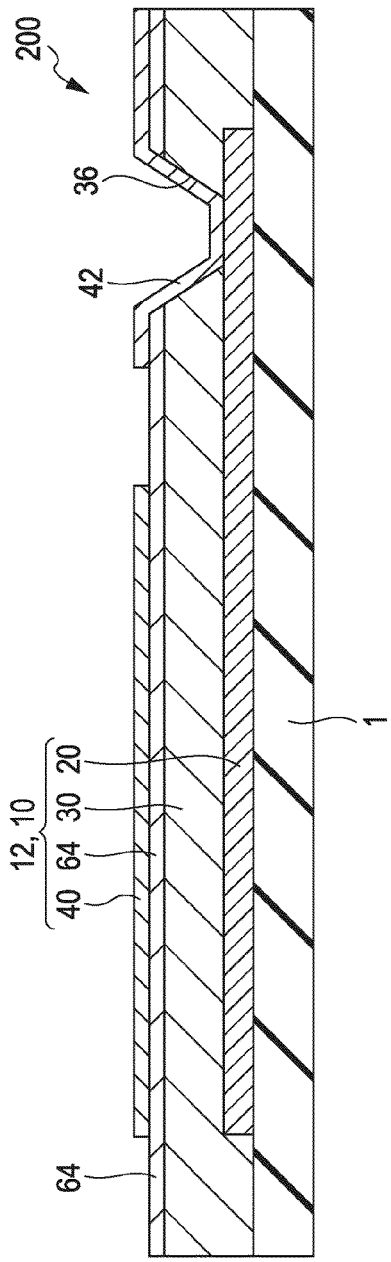

PIEZOELECTRIC ELEMENT, PIEZOELECTRIC ACTUATOR, LIQUID EJECTING HEAD AND LIQUID EJECTING APPARATUS

This application claims a priority to Japanese Patent Application No.: 2010-156018 filed on Jul. 8, 2010 and 2011-060616 filed on Mar. 18, 2011 which are hereby expressly incorporated by reference herein in its entirety.

BACKGROUND

1. Technical Field

The present invention relates to a piezoelectric element, a piezoelectric actuator, a liquid ejecting head, and a liquid ejecting apparatus.

2. Related Art

A piezoelectric element is an element having a characteristic of changing a shape thereof if a voltage is applied thereto and has a configuration in which a piezoelectric body is sandwiched between electrodes. The piezoelectric element is used for various applications such as a liquid ejecting head portion of an ink jet printer, various actuators, and the like, for example.

In the piezoelectric element, if moisture makes contact with the piezoelectric body, for example, a leak current generated between two electrodes is increased, resulting in deterioration in reliability of the piezoelectric element in some case. As a method of preventing the piezoelectric body from making contact with moisture, for example, a configuration in which the piezoelectric body is covered by an upper electrode has been proposed (see, JP-A-2009-172878).

However, in the configuration in which the piezoelectric body is covered by the upper electrode, stress is concentrated on connecting portions between side surfaces of the piezoelectric body and an upper surface of a substrate (for example, vibration plate) and cracking is generated on the upper electrode covering the connecting portions in some case. As a result, reliability of the piezoelectric element is deteriorated.

SUMMARY

An advantage of some aspects of the invention is to provide a piezoelectric element having high reliability. Further, another advantage of some aspects of the invention is to provide a piezoelectric actuator, a liquid ejecting head, and a liquid ejecting apparatus which include the above piezoelectric element.

A piezoelectric element according to an aspect of the invention includes a first electrode, a first piezoelectric layer which is formed at an upper side of the first electrode and lateral sides to the first electrode, a porous layer which is formed so as to cover side surfaces of the first piezoelectric layer, and a second electrode which is formed at an upper side of the first piezoelectric layer and the porous layer. In the piezoelectric element according to the aspect of the invention, the porous layer contains at least one metal element constituting the first piezoelectric layer.

According to such piezoelectric element, the second electrode does not cover connecting portions of the side surfaces of the first piezoelectric layer and an upper surface of the substrate. Therefore, cracking can be prevented from being generated on the second electrode. Accordingly, such piezoelectric element can have high reliability.

It is to be noted that in the description according to the aspect of the invention, an expression "upper side" is used in such a manner that "one specific member (hereinafter, referred to as "A") is formed at the "upper side" of another specific member (hereinafter, referred to as "B")", for example. In the description according to the aspect of the invention, in the above example, the expression "upper side" is used in a case where A is formed directly on B and a case where A is formed on B through another member.

In the piezoelectric element according to the aspect of the invention, it is preferable that density of the porous layer become larger toward the first piezoelectric layer.

According to such piezoelectric element, for example, when the substrate has a vibration plate, displaceability of the vibration plate can be gradually changed toward the first piezoelectric layer. Therefore, stress can be suppressed from being concentrated on the substrate (vibration plate).

In the piezoelectric element according to the aspect of the invention, it is preferable that the piezoelectric element further include an insulating layer formed between the porous layer and the second electrode.

According to such piezoelectric element, flatness of the second electrode can be enhanced. For example, a water-barrier function of the second electrode can be enhanced.

In the piezoelectric element according to the aspect of the invention, it is preferable that a Young's modulus of the insulating layer be smaller than a Young's modulus of the second electrode.

According to such piezoelectric element, stress can be suppressed from being concentrated on the second electrode covering corner portions of the insulating layer, for example.

In the piezoelectric element according to the aspect of the invention, it is preferable that side surfaces of the insulating layer be inclined with respect to an upper surface of the first piezoelectric layer.

According to such piezoelectric element, stress can be suppressed from being concentrated on the second electrode covering corner portions of the insulating layer, for example.

In the piezoelectric element according to the aspect of the invention, it is preferable that the piezoelectric element further include a second piezoelectric layer which is formed between the first piezoelectric layer and the porous layer, and the second electrode.

According to such piezoelectric element, flatness of the second electrode can be enhanced. For example, stress on the second electrode can be reduced. Further, the second piezoelectric layer can function as a water-barrier layer. Therefore, the piezoelectric element can have high reliability.

In the piezoelectric element according to the aspect of the invention, it is preferable that a material of the second piezoelectric layer be the same as a material of the first piezoelectric layer.

According to such piezoelectric element, difference in crystallinity between the first piezoelectric layer and the second piezoelectric layer can be reduced. Therefore, the piezoelectric element can have high reliability.

In the piezoelectric element according to the aspect of the invention, it is preferable that the piezoelectric element further include a third piezoelectric layer at the lower side of the porous layer.

According to such piezoelectric element, the third piezoelectric layer can function as an adhesion layer between the porous layer and the substrate.

In the piezoelectric element according to the aspect of the invention, it is preferable that a material of the third piezoelectric layer be the same as the material of the first piezoelectric layer.

According to such piezoelectric element, difference in crystallinity between the first piezoelectric layer and the third piezoelectric layer can be reduced. Therefore, the piezoelectric element can have high reliability.

A piezoelectric element according to another aspect of the invention includes a first electrode, a first piezoelectric layer which is formed at the upper side of the first electrode, a porous layer which is formed so as to cover corner portions which are formed by side surfaces of the first electrode and an upper surface of the first electrode and side surfaces of the first piezoelectric layer, a third electrode (hereinafter, referred to as "lower second electrode") which is formed at the upper side of the first piezoelectric layer, and a second electrode (hereinafter, referred to as "upper second electrode") which is formed at the upper side of the lower second electrode and the porous layer and is electrically connected to the lower second electrode. In the piezoelectric element according to the aspect of the invention, the porous layer contains at least one metal element constituting the first piezoelectric layer.

According to such piezoelectric element, breakage of the first piezoelectric layer due to concentration of electric fields on the corner portions of the first electrodes can be suppressed.

It is to be noted that in the description according to the aspect of the invention, an expression "electrically connect" is used in such a manner that "one specific member (hereinafter, referred to as "C member") is "electrically connected" to another specific member (hereinafter, referred to as "D member")", for example. In description according to the aspect of the invention, in the above example, the expression "electrically connect" is used in a case where the C member and the D member make contact with each other and are electrically connected with each other and a case where the C member and the D member are electrically connected with each other through another member.

In the piezoelectric element according to the aspect of the invention, it is preferable that the first electrode, the first piezoelectric layer and the second electrode form a laminated body, a plurality of laminated bodies be provided, the plurality of laminated bodies be arranged in line along a short-side direction of the first electrodes, the first electrodes be individual electrodes on the plurality of laminated bodies, the second electrode be a common electrode to the plurality of laminated bodies, and the porous layer be formed between the plurality of laminated bodies.

According to such piezoelectric element, the first piezoelectric layer can be further prevented from making contact with moisture with the second electrode.

In the piezoelectric element according to the aspect of the invention, it is preferable that the material of the first piezoelectric layer be lead zirconate titanate.

Such piezoelectric element can have high reliability.

A piezoelectric actuator according to still another aspect of the invention includes the piezoelectric element according to the aspect of the invention.

Such piezoelectric actuator includes the piezoelectric element according to the aspect of the invention. Therefore, the piezoelectric actuator can have high reliability.

A liquid ejecting head according to still another aspect of the invention includes the piezoelectric actuator according to the aspect of the invention, and a pressure chamber which communicates with a nozzle hole discharging liquid. In the liquid ejecting head according to the aspect of the invention, a width of the pressure chamber along a short-side direction of the first electrode is larger than a width of the first piezoelectric layer along the short-side direction, and at least a part of the porous layer is located at the upper side of the pressure chamber.

Such liquid ejecting head includes the piezoelectric actuator according to the aspect of the invention. Therefore, the liquid ejecting head can have high reliability.

A liquid ejecting apparatus according to still another aspect of the invention includes the liquid ejecting head according to the aspect of the invention.

Such liquid ejecting apparatus includes the liquid ejecting head according to the aspect of the invention. Therefore, the liquid ejecting apparatus can have high reliability.

BRIEF DESCRIPTION OF THE DRAWINGS

The invention will be described with reference to the accompanying drawings, wherein like numbers reference like elements.

FIGS. 1A and 1B are cross-sectional views schematically illustrating a piezoelectric element according to a first embodiment.

FIGS. 3A and 3B are cross-sectional views schematically illustrating a manufacturing process of the piezoelectric element according to the first embodiment.

FIGS. 4A and 4B are cross-sectional views schematically illustrating the manufacturing process of the piezoelectric element according to the first embodiment.

FIGS. 8A and 8B are cross-sectional views schematically illustrating a piezoelectric element according to a second embodiment.

DESCRIPTION OF EXEMPLARY EMBODIMENTS

Hereinafter, preferred embodiments of the invention are described with reference to drawings.

1 Piezoelectric Element

1.1 First Embodiment 1.1.1 Piezoelectric Element

Figure 2:
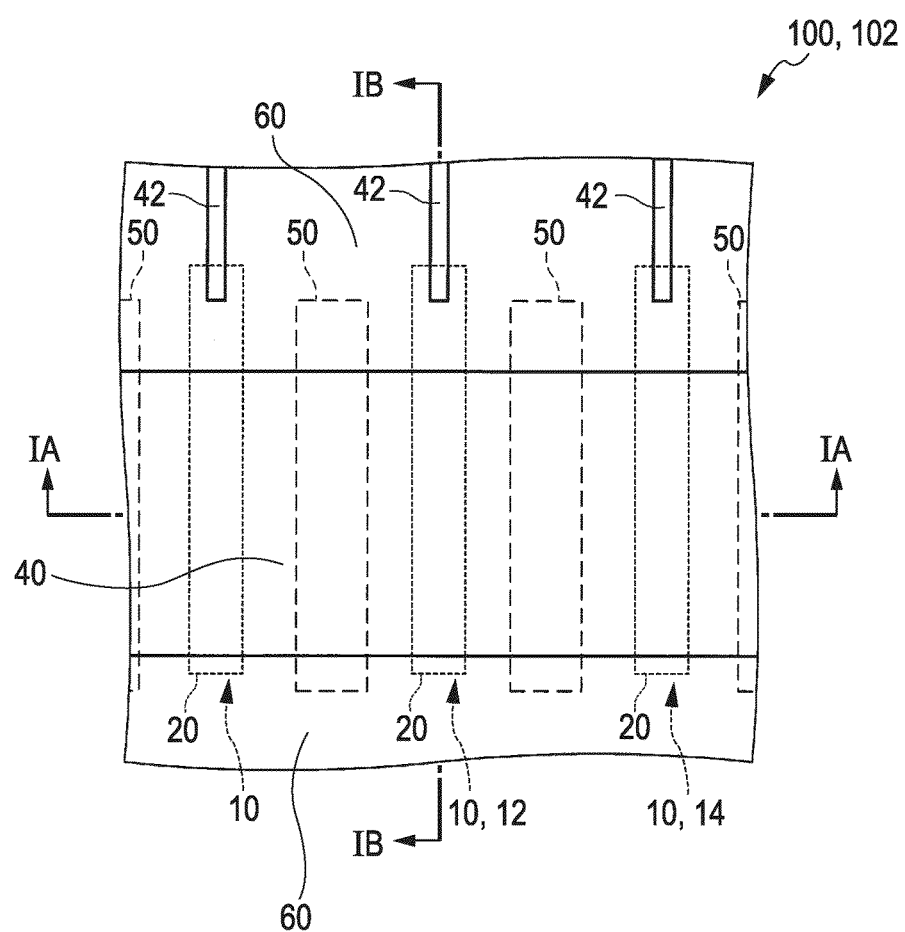
FIG. 2 is a plan view schematically illustrating the piezoelectric element according to the first embodiment.

At first, a piezoelectric element according to a first embodiment is described with reference to drawings. FIGS. 1A and 1B are cross-sectional views schematically illustrating a piezoelectric element 100 according to the first embodiment. FIG. 2 is a plan view schematically illustrating the piezoelectric element 100 according to the first embodiment. It is to be noted that FIG. 1A is a cross-sectional view cut along a line IA-IA in FIG. 2 and FIG. 1B is a cross-sectional view cut along a line IB-IB in FIG. 2.

As illustrated in FIGS. 1A and 1B and FIG. 2, the piezoelectric element 100 is formed on a substrate 1 and can include laminated bodies 10, porous layers 50, insulating layers 60, and wiring layers 42. Each laminated body 10 can include a first electrode 20, a first piezoelectric layer 30, and a second electrode 40.

The substrate 1 is a flat plate formed with a semiconductor or an insulator, for example. The substrate 1 may have a single layer structure or a structure in which a plurality of layers are laminated. An inner structure of the substrate 1 is not limited as long as an upper surface has a planar shape. For example, a space or the like may be formed in the substrate 1. For example, as in a liquid ejecting head, which will be described later, in a case where pressure chambers and the like are formed at the lower side of the substrate 1, a plurality of structures formed at the lower side of the substrate 1 may be collectively regarded as one substrate 1.

The substrate 1 may have a vibration plate which has flexibility and can be deformed (bent) with operations of the first piezoelectric layers 30. In this case, the piezoelectric element 100 serves as a piezoelectric actuator 102 including the vibration plate. When the piezoelectric actuator 102 is used in a liquid ejecting head, volumes of the pressure chambers can be changed with deflection of the substrate 1 (vibration plate). When the substrate 1 has the vibration plate, as a material of the vibration plate, for example, inorganic oxide such as zirconium oxide ($ZrO_2$), silicon nitride, or silicon oxide, and alloy such as stainless steel can be used. The vibration plate may have a single layer structure of the material as exemplified above or a structure in which a plurality of materials mentioned above are laminated.

It is to be noted that the substrate 1 may not have a vibration plate and the first electrodes 20 may be vibration plates. That is to say, each first electrode 20 may have a function as one electrode for applying a voltage to each first piezoelectric layer 30 and a function as a vibration plate which can be deformed with the operation of each first piezoelectric layer 30. In this case, too, the piezoelectric element 100 can serve as the piezoelectric actuator 102.

The laminated bodies 10 are formed on the substrate 1. For example, a plurality of laminated bodies 10 are provided. Although three laminated bodies 10 are provided in an example as illustrated in FIG. 1A and FIG. 2, the number of the laminated bodies 10 is not particularly limited. The plurality of laminated bodies 10 are provided so as to be separated from each other. The plurality of laminated bodies 10 may be arranged in line in a first direction (short-side direction of the first electrodes 20, for example) when seen from above as illustrated in FIG. 2. For example, the first direction can be set to a parallel arrangement direction of the first electrodes 20.

The first electrodes 20 are formed on the substrate 1. Although not illustrated in the drawings, a layer for providing an adhesion property between the first electrodes 20 and the substrate 1 or a layer for providing strength or conductivity may be formed between the first electrodes 20 and the substrate 1. As examples of these layers, for example, layers made of various metals such as titanium, nickel, iridium, or platinum, or oxides thereof can be exemplified.

Each first electrode 20 has a layer shape or a thin film shape, for example. The thickness of each first electrode 20 is equal to or larger than 50 nm and equal to or smaller than 300 nm, for example. Planar shapes of the first electrodes 20 are not particularly limited as long as the first piezoelectric layers 30 can be arranged between the first electrodes 20 and the second electrode 40 when the second electrode 40 is arranged so as to be opposed to the first electrodes 20. In the example as illustrated in FIG. 2, the first electrodes 20 have rectangular shapes having longer sides (sides in the lengthwise direction) and shorter sides (sides in the short-side direction). Accordingly, it can be said that FIG. 1A is a cross-sectional view cut along the short-side direction of the first electrodes 20 and FIG. 1B is a cross-sectional view cut along the lengthwise direction of the first electrodes 20.

As a material of each first electrode 20, for example, various metals such as nickel, iridium and platinum, conductive oxides thereof (for example, iridium oxide and the like), composite oxide of strontium and ruthenium ($SrRuO_x$:SRO), composite oxide of lanthanum and nickel ($LaNiO_x$:LNO), and the like can be exemplified. Each first electrode 20 may have a single layer structure of the material as exemplified above or a structure in which a plurality of materials mentioned above are laminated.

As one of the functions of the first electrodes 20, the first electrodes 20 and the second electrode 40 form pairs and the first electrodes 20 serve as one side electrodes (for example, lower electrodes formed at the lower side of the first piezoelectric layers 30) for applying a voltage to the first piezoelectric layers 30. As illustrated in FIG. 1A and FIG. 2, the first electrodes 20 may be individual electrodes on the plurality of laminated bodies 10. To be more specific, the first electrode 20 of the first laminated body 12 among the plurality of laminated bodies 10 and the first electrode 20 of the second laminated body 14 among the plurality of laminated bodies 10 may be electrically separated from each other.

As illustrated in FIG. 1A, the first piezoelectric layers 30 are formed on the first electrodes 20 and lateral sides to the first electrodes 20. The thickness of each first piezoelectric layer 30 is equal to or larger than 300 nm and equal to or smaller than 3000 nm, for example.

Each first piezoelectric layer 30 is formed with a piezoelectric material. Therefore, if a voltage is applied to the first piezoelectric layers 30 by the first electrodes 20 and the second electrode 40, the first piezoelectric layers 30 can be deformed. When the piezoelectric element 100 is the piezoelectric actuator 102, the vibration plate can be deformed (bent) with the deformation.

As a material of each first piezoelectric layer 30, perovskite oxide expressed by a general formula $ABO_3$ (for example, A contains Pb, and B contains Zr and Ti) is preferable. Specific examples of such material include lead zirconate titanate (Pb(Zr,Ti)O$_3$: PZT), barium titanate (BaTiO$_3$), potassium sodium niobate ((K,Na)NbO$_3$), and the like.

In the example as illustrated in FIG. 1A, side surfaces 32 of the first piezoelectric layers 30 are inclined with respect to an upper surface 2 of the substrate 1. However, the shapes of the side surfaces 32 are not limited thereto and the side surfaces 32 may be formed so as to be substantially perpendicular to the upper surface 2. Further, the side surfaces 32 of the first piezoelectric layers 30 may have a fine irregular shape.

The second electrode 40 is formed on the first piezoelectric layers 30. The second electrode 40 is arranged so as to be opposed to the first electrodes 20. The second electrode 40 has a layer shape or a thin film shape, for example. The thickness of the second electrode 40 is equal to or larger than 50 nm and equal to or smaller than 300 nm, for example. A planar shape of the second electrode 40 is not particularly limited as long as the first piezoelectric layers 30 can be arranged between the second electrode 40 and the first electrodes 20 when the second electrode 40 is arranged so as to be opposed to the first electrodes 20.

As a material of the second electrode 40, for example, various metals such as nickel, iridium and platinum, conductive oxides thereof (for example, iridium oxide and the like), composite oxide of strontium and ruthenium (SrRuO$_x$:SRO), composite oxide of lanthanum and nickel (LaNiO$_x$:LNO), and the like can be exemplified. The second electrode 40 may have a single layer structure of the material as exemplified above or a structure in which a plurality of materials are laminated.

As one of the functions of the second electrode 40, the second electrode 40 and the first electrodes 20 form pairs and the second electrode 40 serves as the other electrode (for example, an upper electrode formed at the upper side of the first piezoelectric layers 30) for applying a voltage to the first piezoelectric layers 30. As illustrated in FIG. 1A and FIG. 2, the second electrode 40 may be a common electrode to the plurality of laminated bodies 10. To be more specific, the second electrode 40 of the first laminated body 12 and the second electrode 40 of the second laminated body 14 may be electrically connected to each other. In the example as illustrated in FIGS. 1A and 1B, the second electrode 40 of the first laminated body 12 and the second electrode 40 of the second laminated body 14 are integrally formed as a common electrode.

As illustrated in FIG. 1A, the porous layers 50 are formed at the upper side of the substrate 1 so as to cover the side surfaces 32 of the first piezoelectric layers 30. The porous layers 50 may be formed so as to be in contact with the upper surface 2 of the substrate 1 and the side surfaces 32 of the first piezoelectric layers 30. In the example as illustrated in FIG. 1A, the porous layers 50 are formed between the plurality of laminated bodies 10. To be more specific, the porous layer 50 is formed between the first laminated body 12 and the second laminated body 14 adjacent to the first laminated body 12. Upper surfaces 52 of the porous layers 50 are flush with upper surfaces 34 of the first piezoelectric layers 30, for example.

A material of each porous layer 50 contains at least one metal element constituting each first piezoelectric layer 30. When the material of each first piezoelectric layer 30 is lead zirconate titanate, the material of each porous layer 50 is an oxide containing a lead-based metal element, for example. The porous layers 50 can have a number of fine holes. Therefore, density of the porous layers 50 is smaller than that of the first piezoelectric layers 30. The density of the porous layer 50 may become larger toward the laminated bodies 10.

The insulating layers 60 are formed on the porous layers 50. In the example as illustrated in FIG. 1A, the insulating layers 60 are further formed on parts of the upper portions of the first piezoelectric layers 30. As illustrated in FIG. 1A, side surfaces 62 of the insulating layers 60 may be inclined with respect to the upper surfaces 34 of the first piezoelectric layers 30. That is to say, the widths (sizes of the insulating layers 60 in the direction perpendicular to the thickness direction thereof) of the insulating layers 60 may be smaller toward the upper side.

The thickness of each insulating layer 60 is equal to or larger than 50 nm and equal to or smaller than 500 nm, for example. A young's modulus of each insulating layer 60 may be smaller than that of the second electrode 40. That is to say, a material of each insulating layer 60 may be softer than that of the second electrode 40. As the material of each insulating layer 60, for example, photosensitive polyimide and photosensitive cyclotene (BCB) can be cited.

The second electrode 40 can be formed on the insulating layers 60 (at the upper side of the porous layers 50). With this, as described above, the second electrode 40 can be set to be a common electrode to the plurality of laminated bodies 10.

As illustrated in FIG. 1B, each wiring layer 42 is formed in a contact hole 36 provided on each first piezoelectric layer 30 (to be more specific, a portion of the first piezoelectric layer 30, which is not sandwiched between the electrodes 20, 40). The wiring layers 42 are electrically connected to the first electrodes 20, for example. Therefore, a voltage can be applied to the first electrodes 20 through the wiring layers 42. The thickness of each wiring layer 42 is equal to or larger than 50 nm and equal to or smaller than 300 nm, for example. The material of each wiring layer 42 is the same as that of the second electrode 40, for example.

The piezoelectric element 100 according to the first embodiment has the following characteristics, for example.

According to the piezoelectric element 100, the porous layers 50 are formed so as to cover the side surfaces 32 of the first piezoelectric layers 30. Therefore, in the piezoelectric element 100, the second electrode 40 does not cover connecting portions of the side surfaces 32 of the first piezoelectric layers 30 and the upper surface 2 of the substrate 1 so that cracking can be prevented from being generated on the second electrode 40. Accordingly, the piezoelectric element 100 can have high reliability. If cracking is generated on the porous layers 50, since the porous layers 50 are originally porous, influence by the cracking on the porous layers 50 on reliability of the piezoelectric element 100 is small. Further, in the piezoelectric element 100, the second electrode 40 is formed at the upper side of the first piezoelectric layers 30 and the porous layers 50. Therefore, the first piezoelectric layers 30 can be prevented from making contact with moisture with the second electrode 40. In addition, in the piezoelectric element 100, the porous layers 50 are formed on the substrate 1. Therefore, for example, when the substrate 1 has a vibration plate, displacement of the vibration plate can be suppressed from being hindered. If a material having the substantially same density as the piezoelectric body is formed on the substrate, displacement of the vibration plate is hindered due to the material in some case.

According to the piezoelectric element 100, the density of the porous layers 50 can become larger toward the first piezoelectric layers 30. Therefore, for example, when the substrate 1 has a vibration plate, displaceability of the vibration plate can be gradually changed toward the first piezoelectric layers 30. If the density of the porous layers is uniform and is smaller than that of the piezoelectric bodies, difference in the density between the porous layers and the piezoelectric bodies is generated. Therefore, the difference in displaceability between the vibration plate at the lower side of the porous layers and the vibration plate at the lower side of the piezoelectric bodies is generated. As a result, stress is concentrated on the vibration plate (substrate) in some case. In the piezoelectric element 100, such problem can be prevented from occurring. Characteristics obtained by providing the porous layers 50 are the same in other embodiments.

According to the piezoelectric element 100, the insulating layers 60 are formed on the porous layers 50 and the second electrode 40 can be formed on the insulating layers 60. With this, flatness of the second electrode 40 can be enhanced. For example, a water-barrier function of the second electrode 40 can be enhanced. If the second electrode is formed directly on the porous layers, the second electrode enters the holes of the porous layers so that the surface of the second electrode becomes irregular in some case. As a result, the water-barrier function of the second electrode is deteriorated in some case. Note that the insulating layers 60 can also have the water-barrier function.

According to the piezoelectric element 100, the upper surfaces 34 of the first piezoelectric layers 30 are flush with the upper surfaces 52 of the porous layers 50 and a Young's modulus of each insulating layer 60 can be made smaller than that of the second electrode 40. Therefore, for example, stress can be suppressed from being concentrated on the second electrode 40 covering corner portions of the insulating layers 60.

According to the piezoelectric element 100, the upper surfaces 34 of the first piezoelectric layers 30 are flush with the upper surfaces 52 of the porous layers 50 and the side surfaces 62 of the insulating layers 60 can be inclined with respect to the upper surfaces 34 of the first piezoelectric layers 30. Therefore, for example, stress can be suppressed from being concentrated on the second electrode 40 covering the corner portions of the insulating layers 60. Characteristics obtained by providing the insulating layers 60 are the same in a fourth embodiment.

According to the piezoelectric element 100, the first electrodes 20 can be set to be individual electrodes and the second electrode 40 can be set to be a common electrode. With this, the first piezoelectric layers 30 can be further suppressed from making contact with moisture with the second electrode 40. Characteristics obtained by setting the second electrode 40 to be a common electrode are the same in other embodiments.

1.1.2 Method of Manufacturing Piezoelectric Element

Next, a method of manufacturing the piezoelectric element 100 according to the first embodiment is described with reference to drawings. FIG. 3A through FIG. 7B are cross-sectional views schematically illustrating a manufacturing process of the piezoelectric element 100 according to the first embodiment. Note that in FIG. 3A through FIG. 7B, FIGS. 3A, 4A, 5A, 6A, 7A correspond to FIG. 1A, and FIGS. 3B, 4B, 5B, 6B, 7B correspond to FIG. 1B.

As illustrated in FIGS. 3A and 3B, the first electrodes 20 are formed on the substrate 1. The first electrodes 20 are formed by film-forming a first electrode layer (not illustrated) with a sputtering method, a plating method or a vacuum deposition method, for example, and patterning the first electrode layer. The patterning is performed using a photolithography technique or an etching technique, for example.

As illustrated in FIGS. 4A and 4B, a first piezoelectric layer 30a is film-formed on the substrate 1 so as to cover the first electrodes 20. The first piezoelectric layer 30a is film-formed by a sol-gel method, a Chemical Vapor Deposition (CVD) method, a Metal Organic Deposition (MOD) method, a sputtering method, or a laser ablation method, for example.

Next, resists R1 each having a desired shape are formed on the first piezoelectric layer 30a. The resists R1 are formed by a publicly known method.

Figure 5A:
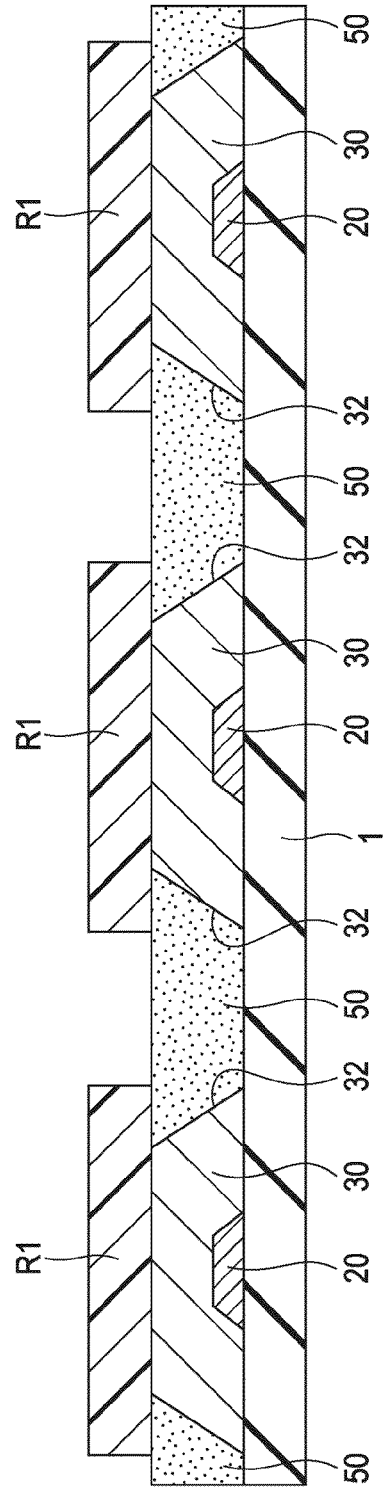
FIGS. 5A and 5B are cross-sectional views schematically illustrating the manufacturing process of the piezoelectric element according to the first embodiment.
Figure 5B:
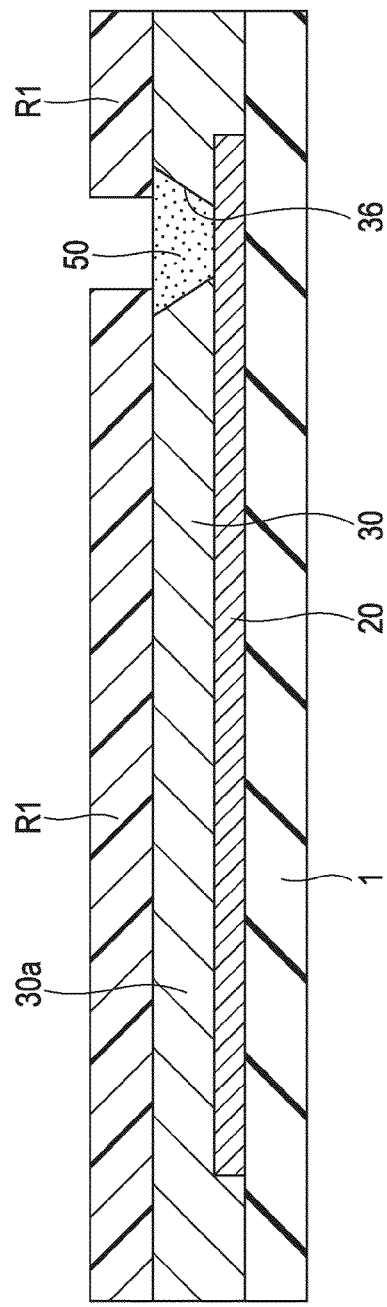

As illustrated in FIGS. 5A and 5B, the porous layers 50 are formed by subjecting the exposed first piezoelectric layer 30a to wet etching, for example, using the resists R1 as masks. Shapes of the first piezoelectric layers 30 are determined with the wet etching. As an etchant, a solution which dissolves at least only some material forming the first piezoelectric layer 30a can be used. Further, a solution which selectively dissolves portions of the first piezoelectric layer 30a which are not completely formed into crystals like grain boundaries can be used. Therefore, some portions of the first piezoelectric layer 30a are not removed and oxides containing undissolved elements and reactants obtained by reacting with components of the etchant are left so that the porous layers 50 are formed. To be more specific, for example, a 10% aqueous hydrofluoric acid solution can be used as the etchant.

After the wet etching has been performed, the resists R1 are removed by a publicly known method, for example. Further, after the wet etching has been performed, a postprocessing suitable to the etchant, such as washing with water, can be performed.

If the first piezoelectric layer 30a is etched with the wet etching as described above, surface roughness of the side surfaces 32 of the first piezoelectric layers 30 are made larger (the side surfaces 32 of the first piezoelectric layers 30 get rough) in some case depending on the crystallinity of the first piezoelectric layer 30a, for example. However, in the piezoelectric element 100, the second electrode is not formed on the side surfaces 32 of the first piezoelectric layers 30. Therefore, even if the side surfaces 32 get rough, the reliability of the piezoelectric element 100 is not deteriorated. Therefore, since the surface roughness of the side surfaces 32 is not required to be adjusted, process margin can be made large so that yield can be improved. Further, an inexpensive solution such as an aqueous hydrofluoric acid solution can be used as the etchant, thereby reducing manufacturing cost. In addition, throughput can be improved in comparison with a case where the piezoelectric layer is processed using ion-milling, for example.

It is to be noted that the porous layers 50 can be formed between the plurality of first piezoelectric layers 30 as illustrated in FIG. 5A and on portions corresponding to the contact holes 36 as illustrated in FIG. 5B.

Figure 6A:
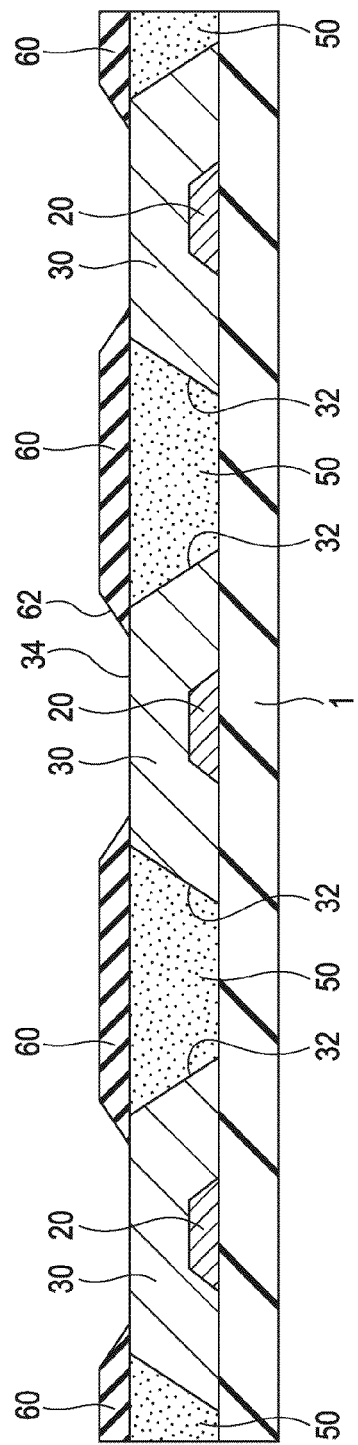
FIGS. 6A and 6B are cross-sectional views schematically illustrating the manufacturing process of the piezoelectric element according to the first embodiment.
Figure 6B:
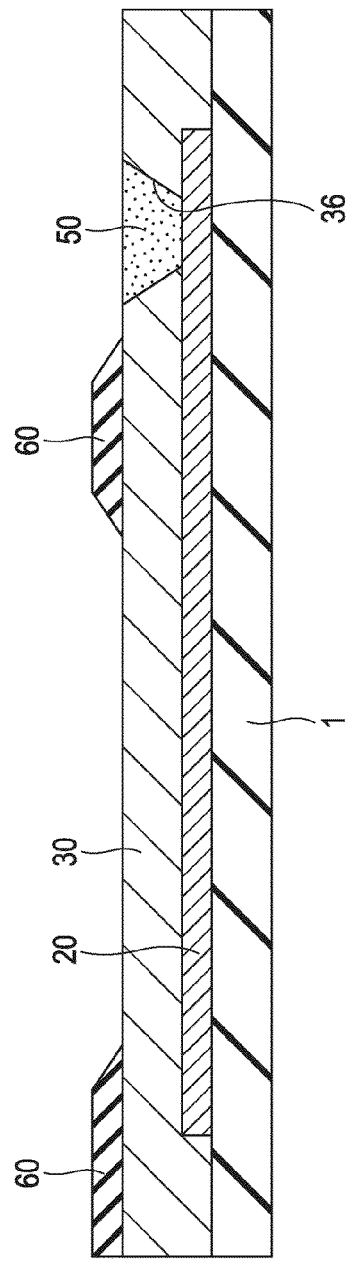

As illustrated in FIGS. 6A and 6B, the insulating layers 60 are formed on the porous layers 50 and parts of the first piezoelectric layers 30. The insulating layers 60 are formed by film-forming an insulating film (not illustrated) with a solution deposition method, for example, and patterning the insulating film. The insulating film is film-formed with the solution deposition method so that flatness of the surfaces of the insulating layers 60 can be enhanced. Therefore, flatness of the second electrode 40 formed on the insulating layers 60 can be also enhanced. For example, if the insulating film is film-formed with the sputtering method or the like, since fine irregularities are formed on the surfaces of the porous layers 50, flatness of the insulating layers 60 is deteriorated in some case.

In addition, when a photosensitive organic material (photosensitive polyimide, photosensitive cyclotene, or the like) is used as the insulating film, the insulating film can be patterned by exposing a protection film with light by an exposure device and then developing it. That is to say, an etching process can be eliminated and low cost can be achieved. Inclination angles of the side surfaces 62 of the insulating layers 60, and the like, can be adjusted by changing exposure conditions and development conditions.

Figure 7A:
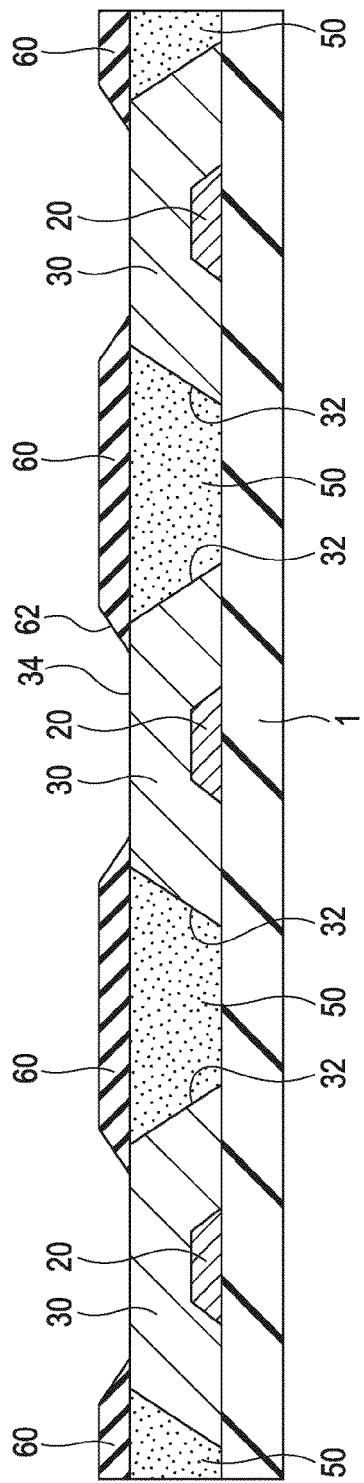
FIGS. 7A and 7B are cross-sectional views schematically illustrating the manufacturing process of the piezoelectric element according to the first embodiment.
Figure 7B:
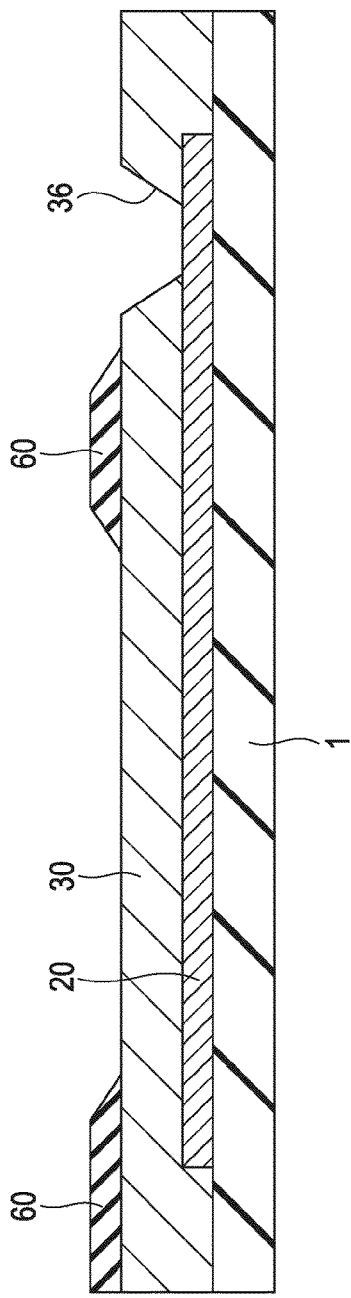

As illustrated in FIG. 7B, the contact holes 36 are formed by removing the exposed porous layers 50 with the wet etching, for example. At this time, the first piezoelectric layers 30 as driving portions are also exposed to the etchant. Therefore, a solution which can selectively etch only the porous layers 50 is desirably used. For example, if a 16% nitric acid aqueous solution is used, only the porous layers 50 can be mainly etched.

Further, when the above protection film is patterned with dry etching, the surfaces (upper surfaces) of the first piezoelectric layers 30 are damaged by over-etching in some case. In such case, only the damaged portions of the surfaces of the first piezoelectric layers 30 can be removed through the wet etching so as to improve the characteristics.

It is to be noted that although not illustrated in the drawing, each contact hole 36 may be formed by separately forming a resist for forming the contact hole 36 and patterning the piezoelectric layer 30a using the resist as a mask.

As illustrated in FIGS. 1A and 1B, the second electrode 40 is formed on the first piezoelectric layers 30 and the insulating layers 60. The second electrode 40 is formed by film-forming a second electrode layer (not illustrated) with a sputtering method, a plating method or a vacuum deposition method, for example, and patterning the second electrode layer. The patterning is performed using a photolithography technique or an etching technique, for example. It is to be noted that the wiring layers 42 may be formed at the same time when the second electrode 40 is formed.

The piezoelectric element 100 can be manufactured with the above processes.

With the method of manufacturing the piezoelectric element 100, the first piezoelectric layers 30 and the porous layers 50 can be formed with the wet etching in the above manner. Therefore, reduction in cost and improvement in throughput can be realized.

1.2 Second Embodiment

1.2.1 Piezoelectric Element

Figure 9:
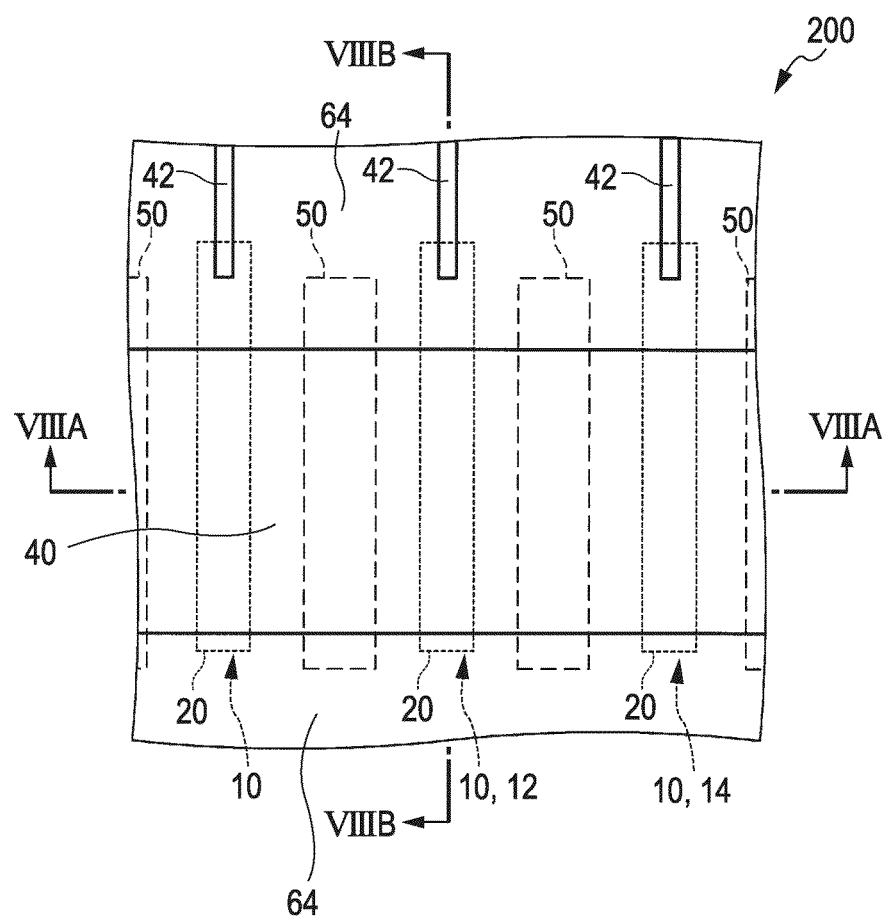
FIG. 9 is a plan view schematically illustrating the piezoelectric element according to the second embodiment.

FIGS. 8A and 8B are cross-sectional views schematically illustrating a piezoelectric element 200 according to a second embodiment. FIG. 9 is a plan view schematically illustrating the piezoelectric element 200 according to the second embodiment. It is to be noted that FIG. 8A is a cross-sectional view cut along a line VIIIA-VIIIA in FIG. 9 and FIG. 8B is a cross-sectional view cut along a line VIIIB-VIIIB in FIG. 9. Hereinafter, in the piezoelectric element 200 according to the second embodiment, the same reference numerals denote members having the same functions as the components of the piezoelectric element 100 according to the first embodiment and detailed description thereof is not repeated.

As illustrated in FIGS. 8A and 8B and FIG. 9, the piezoelectric element 200 is formed on the substrate 1 and can include the laminated bodies 10, the porous layers 50, a second piezoelectric layer 64, and the wiring layers 42. Each laminated body 10 can include the first electrode 20, the first piezoelectric layer 30, the second piezoelectric layer 64, and the second electrode 40.

The piezoelectric element 200 according to the second embodiment is different from the piezoelectric element 100 according to the first embodiment in the following point. That is, the second piezoelectric layer 64 as illustrated in FIG. 8A is included in the second embodiment instead of the insulating layers 60 as illustrated in FIG. 1A in the first embodiment.

As illustrated in FIG. 8A, the second piezoelectric layer 64 is formed on the first piezoelectric layers 30 and the porous layers 50. The thickness of the second piezoelectric layer 64 is equal to or larger than 50 nm and equal to or smaller than 300 nm, for example.

The second piezoelectric layer 64 is formed with a piezoelectric material. Therefore, if a voltage is applied to the second piezoelectric layer 64 by the first electrodes 20 and the second electrode 40, the second piezoelectric layer 64 can be deformed.

As a material of the second piezoelectric layer 64, perovskite oxide expressed by a general formula $ABO_3$ (for example, A contains Pb, and B contains Zr and Ti) is preferable. Specific examples of such material include lead zirconate titanate ($Pb(Zr,Ti)O_3$: PZT), barium titanate ($BaTiO_3$), potassium sodium niobate (($K,Na)NbO_3$), and the like.

The second electrode 40 can be formed on the second piezoelectric layer 64. With this, the second electrode 40 can be set to be a common electrode to the plurality of laminated bodies 10.

The thickness of the second electrode 40 is equal to or larger than 50 nm and equal to or smaller than 300 nm, for example. A planar shape of the second electrode 40 is not particularly limited as long as the first piezoelectric layers 30 and the second piezoelectric layer 64 can be arranged between the second electrode 40 and the first electrodes 20 when the second electrode 40 is arranged so as to be opposed to the first electrodes 20.

The piezoelectric element 200 according to the second embodiment has the following characteristics, for example.

According to the piezoelectric element 200, the second piezoelectric layer 64 can be formed at the upper side of the first piezoelectric layers 30 and the porous layers 50. The second electrode 40 is formed at the upper side of the second piezoelectric layer 64. With this, flatness of the second electrode 40 can be enhanced. Therefore, for example, stress on the second electrode 40 can be reduced. Further, the second electrode can have a water-barrier function as in the characteristics obtained by providing the insulating layers 60 according to the first embodiment. Further, the second piezoelectric layer 64 can have a water-barrier function.

1.2.2 Method of Manufacturing Piezoelectric Element

Next, a method of manufacturing the piezoelectric element 200 according to the second embodiment is described with reference to drawings. FIG. 3A through FIG. 5B and FIG. 10A through FIG. 11B are cross-sectional views schematically illustrating a manufacturing process of the piezoelectric element 200 according to the second embodiment. In FIG. 3A through FIG. 5B and FIG. 10A through FIG. 11B, FIGS. 3A, 4A, 5A, 10A, 11A correspond to FIG. 8A, and FIGS. 3B, 4B, 5B, 10B, 11B correspond to FIG. 8B. Hereinafter, in the method of manufacturing the piezoelectric element 200 according to the second embodiment, FIG. 3A through FIG. 5B illustrating the same manufacturing method as the method of manufacturing the piezoelectric element 100 according to the first embodiment are not described in detail.

Figure 10A:
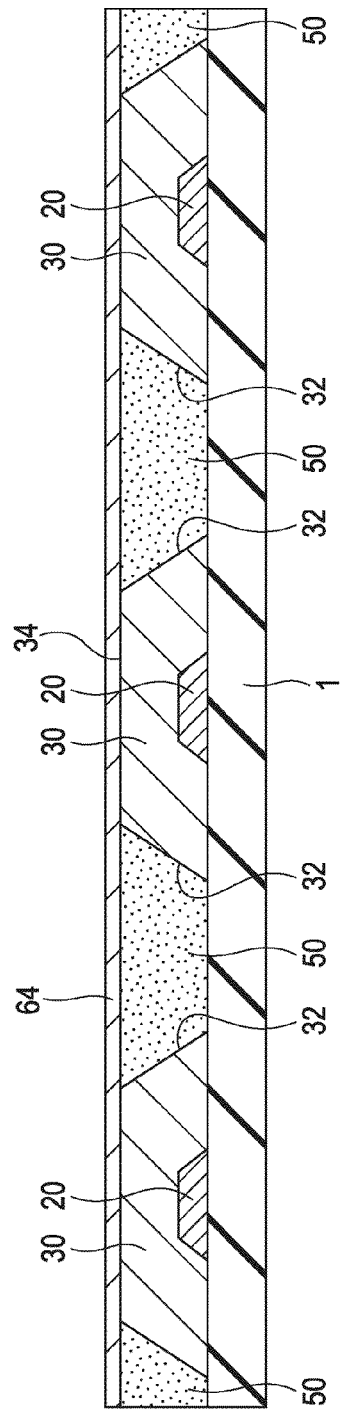
FIGS. 10A and 10B are cross-sectional views schematically illustrating a manufacturing process of the piezoelectric element according to the second embodiment.
Figure 10B:
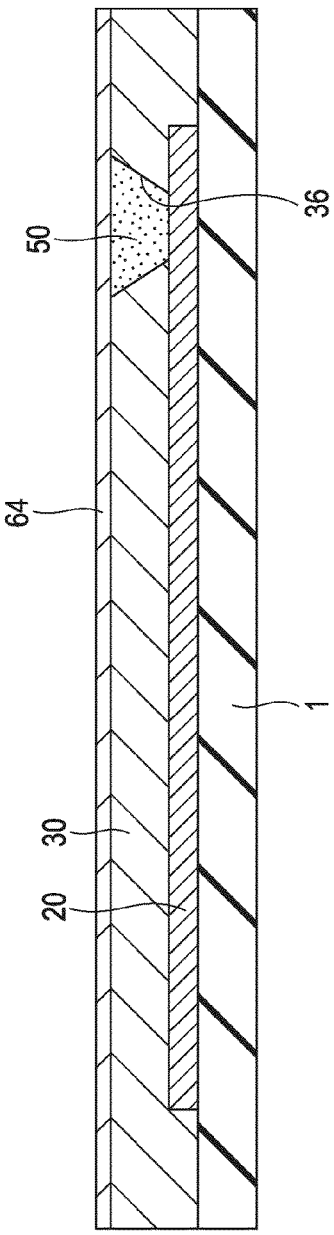

As illustrated FIGS. 10A and 10B, the second piezoelectric layer 64 is formed on the porous layers 50 and the first piezoelectric layers 30. The second piezoelectric layer 64 is formed by film-forming a piezoelectric layer (not illustrated) with the solution deposition method, for example. The piezoelectric layer is film-formed with the solution deposition method so that flatness of the surface of the second piezoelectric layer 64 can be enhanced. If the piezoelectric layer is film-formed with the sputtering method or the like, since the surfaces of the porous layers 50 have fine irregularities, flatness of the second piezoelectric layer 64 is deteriorated in some case. In addition, the patterning process of the second piezoelectric layer 64 as illustrated in FIG. 10A can be eliminated in comparison with the case where the insulating layers 60 according to the first embodiment as illustrated in FIG. 6A are formed through patterning.

Figure 11A:
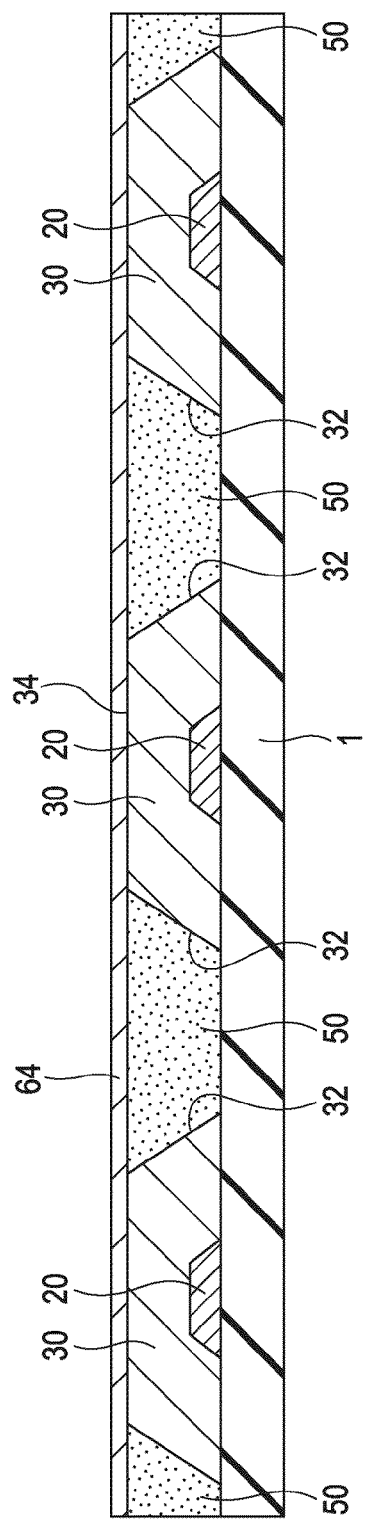
FIGS. 11A and 11B are cross-sectional views schematically illustrating the manufacturing process of the piezoelectric element according to the second embodiment.
Figure 11B:
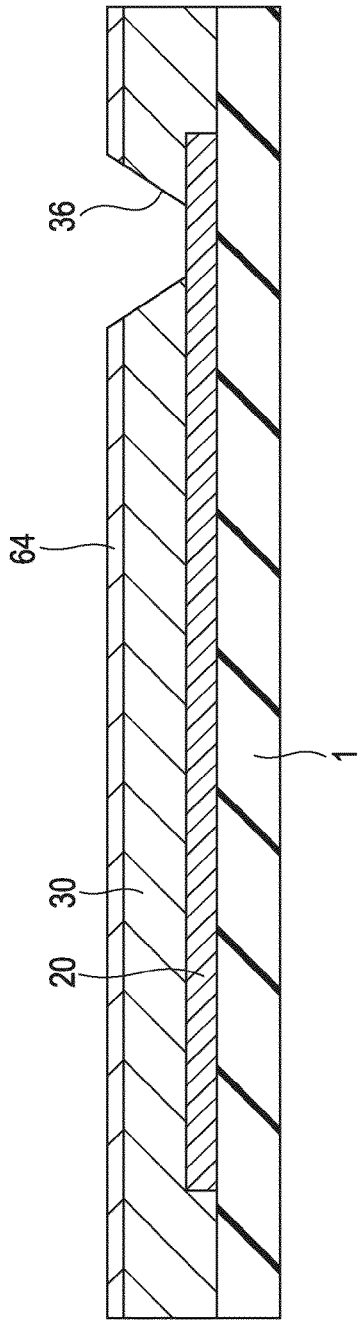

As illustrated in FIG. 11B, each contact hole 36 is formed by separately forming a resist (although not illustrated) and patterning the piezoelectric layer 30 by using the resist as a mask.

As illustrated in FIGS. 8A and 8B, the second electrode 40 is formed on the second piezoelectric layer 64. The second electrode 40 is formed by film-forming a second electrode layer (not illustrated) with a sputtering method, a plating method or a vacuum deposition method, for example, and patterning the second electrode layer. The patterning is performed using a photolithography technique or an etching technique, for example. It is to be noted that the wiring layers 42 may be formed at the same time when the second electrode 40 is formed.

The piezoelectric element 200 can be manufactured with the above processes.

It is to be noted that the second electrode may not be formed at the upper side of the porous layers as long as the second electrode is electrically common.

1.3 Third Embodiment

Figure 12A:
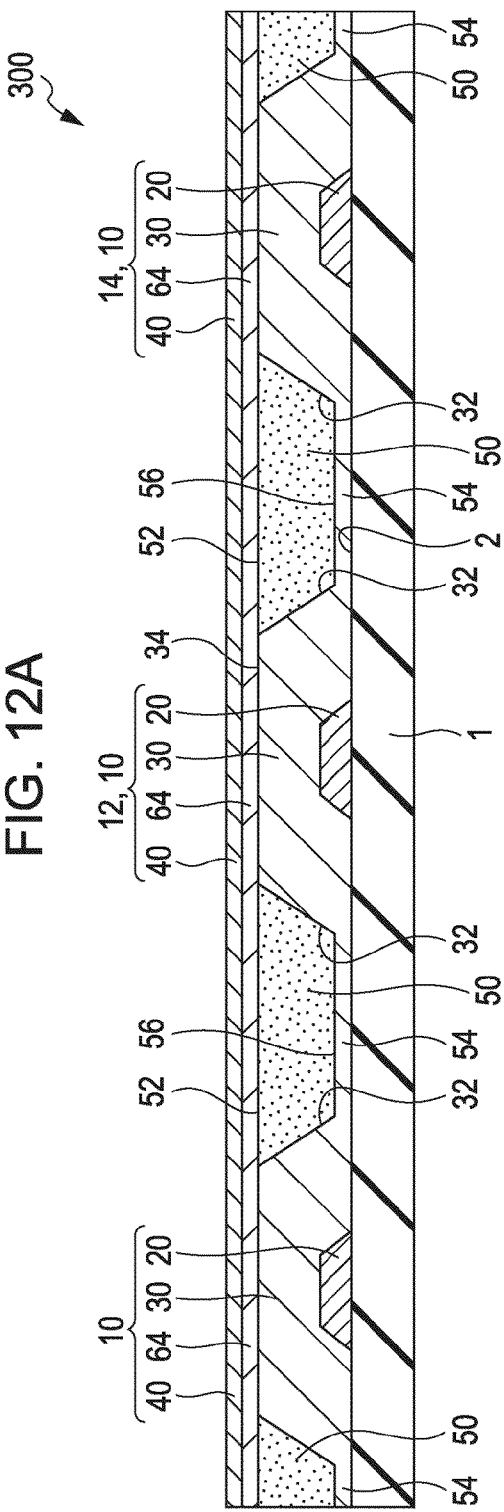
FIGS. 12A and 12B are cross-sectional views schematically illustrating a piezoelectric element according to a third embodiment.
Figure 12B:
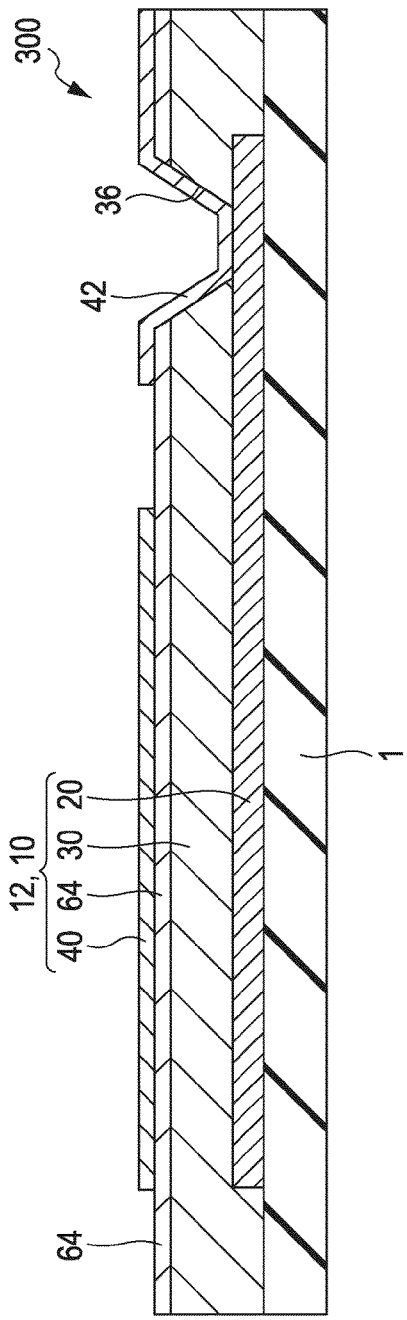
Figure 13:
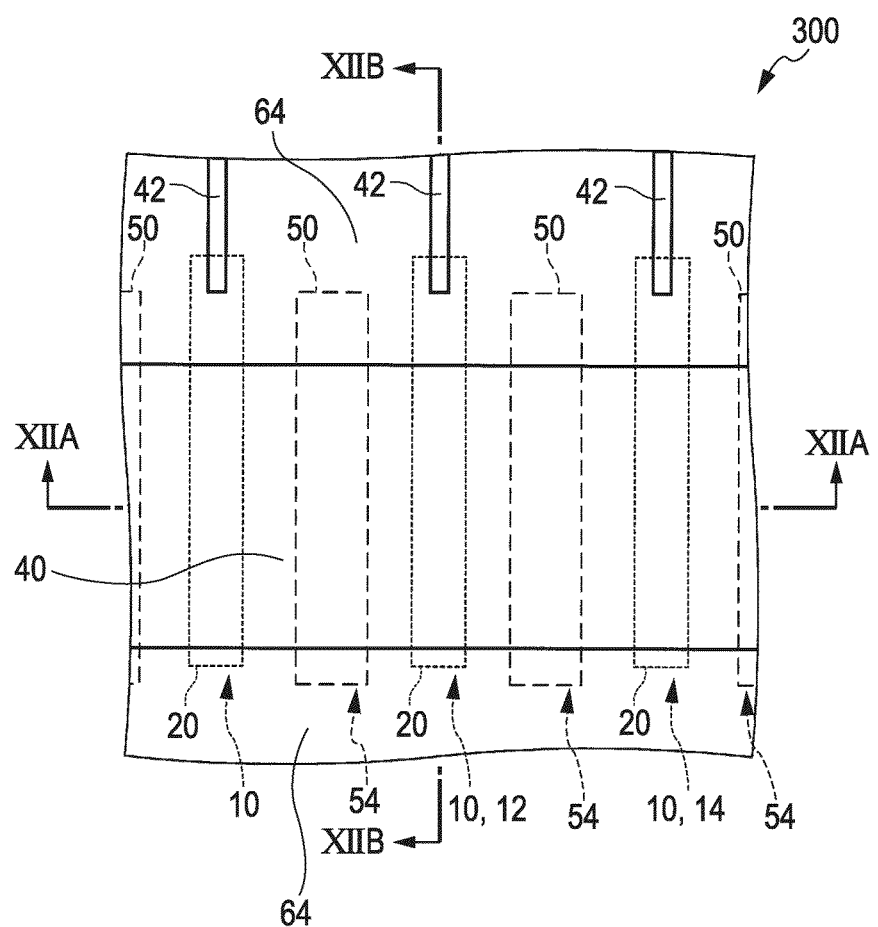
FIG. 13 is a plan view schematically illustrating the piezoelectric element according to the third embodiment.

Next, a piezoelectric element 300 according to a third embodiment is described with reference to drawings. FIGS. 12A and 12B are cross-sectional views schematically illustrating the piezoelectric element 300 according to the third embodiment. FIG. 13 is a plan view schematically illustrating the piezoelectric element 300 according to the third embodiment. It is to be noted that FIG. 12A is a cross-sectional view cut along a line XIIA-XIIA in FIG. 13 and FIG. 12B is a cross-sectional view cut along a line XIIB-XIIB in FIG. 13. Hereinafter, in the piezoelectric element 300 according to the third embodiment, the same reference numerals denote members having the same functions as the components of the piezoelectric element 100 according to the first embodiment and the piezoelectric element 200 according to the second embodiment, and detailed description thereof is not repeated.

As illustrated in FIG. 12A, the piezoelectric element 300 according to the third embodiment has third piezoelectric layers 54 at the lower side of the porous layers 50.

As illustrated in FIG. 12A, upper surfaces 56 of the third piezoelectric layers 54 may be formed so as to be substantially horizontal with respect to the upper surface 2 of the substrate 1. Further, the upper surfaces 56 of the third piezoelectric layers 54 may have fine irregular shapes.

As a material of each third piezoelectric layer 54, perovskite oxide expressed by a general formula $ABO_3$ (for example, A contains Pb, and B contains Zr and Ti) is preferable. Specific examples of such material include lead zirconate titanate $(Pb(Zr,Ti)O_3: PZT)$, barium titanate $(BaTiO_3)$, potassium sodium niobate $((K,Na)NbO_3)$, and the like.

Figure 14A:
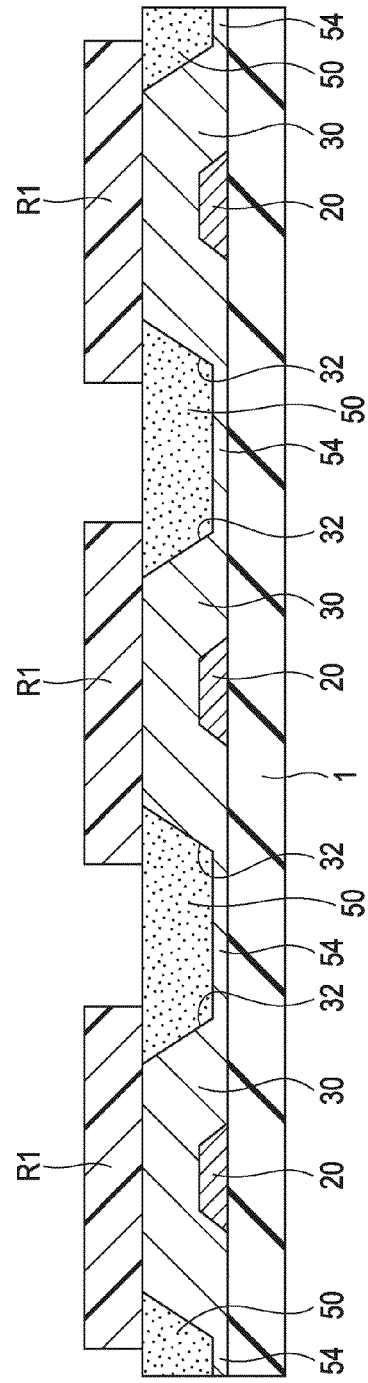
FIGS. 14A and 14B are cross-sectional views schematically illustrating a manufacturing process of the piezoelectric element according to the third embodiment.
Figure 14B:
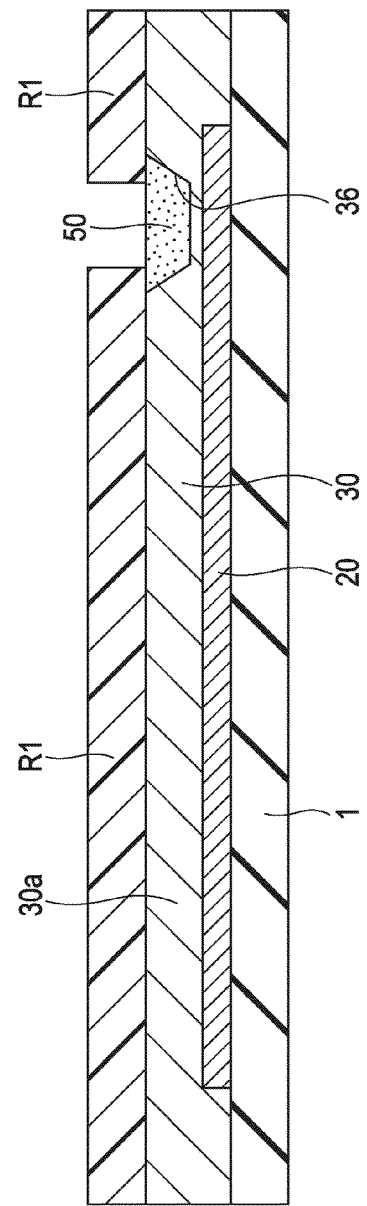

As illustrated in FIGS. 14A and 14B, as a method of manufacturing the third piezoelectric layers 54, the third piezoelectric layers 54 can be formed by adjusting the time of wet etching so as to make the first piezoelectric layers 30 left when the porous layers 50 are formed, for example. The thickness of each third piezoelectric layer 54 is equal to or larger than 50 nm and equal to or smaller than 300 nm, for example.

According to the piezoelectric element 300, the third piezoelectric layers 54 can function as adhesion layers of the porous layers 50 and the substrate 1. Therefore, the piezoelectric element 300 can have high reliability.

1.4 Fourth Embodiment

Figure 15A:
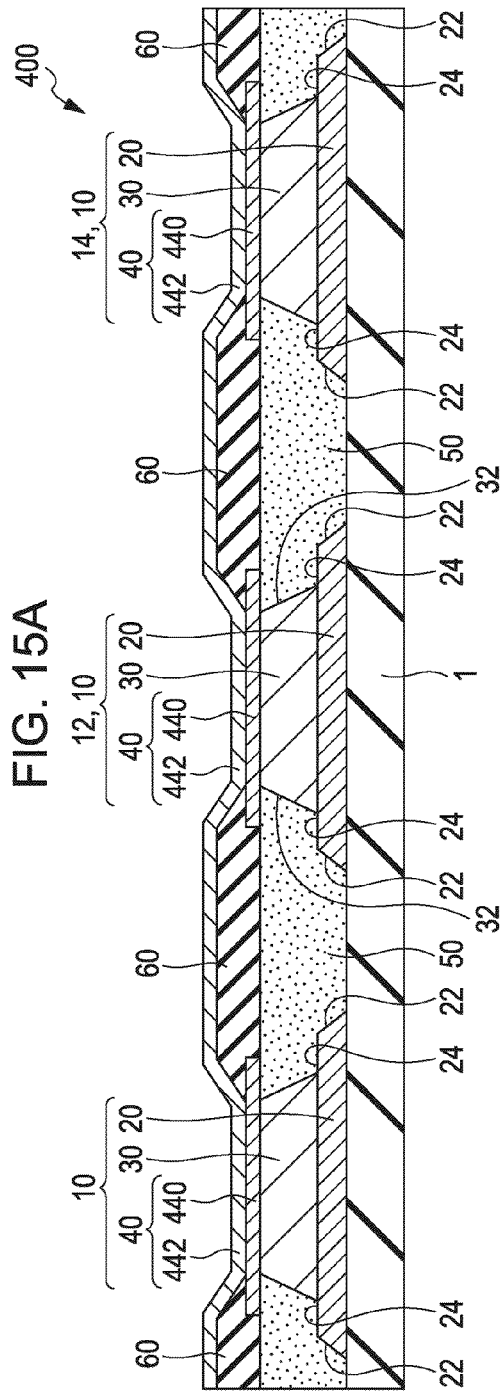
FIGS. 15A and 15B are cross-sectional views schematically illustrating a piezoelectric element according to a fourth embodiment.
Figure 15B:
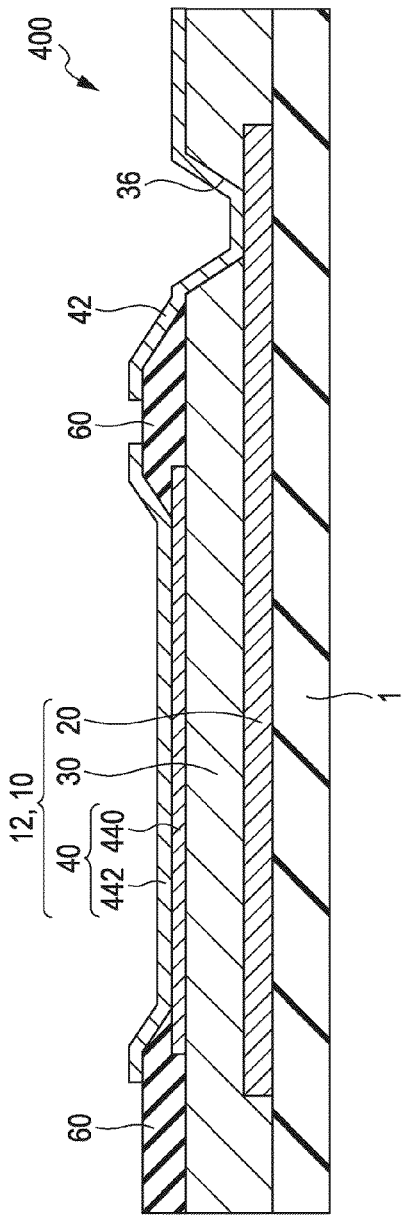
Figure 16:
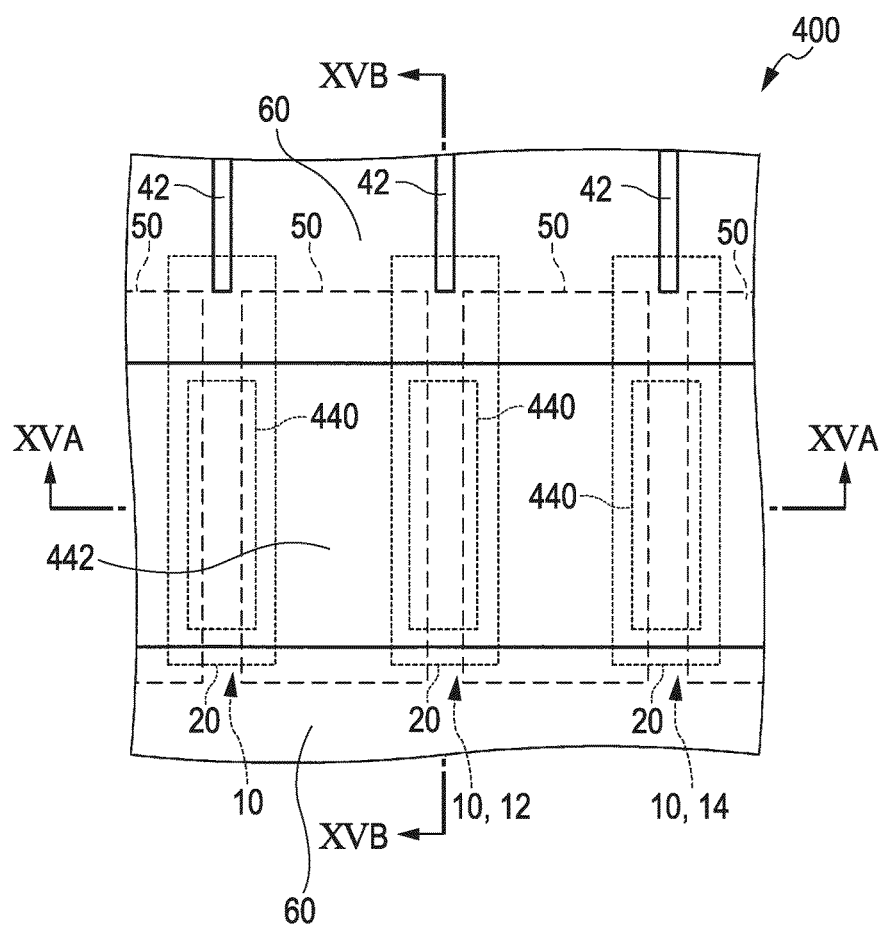
FIG. 16 is a plan view schematically illustrating the piezoelectric element according to the fourth embodiment.

A piezoelectric element 400 according to a fourth embodiment is described with reference to drawings. FIGS. 15A and 15B are cross-sectional views schematically illustrating the piezoelectric element 400 according to the fourth embodiment. FIG. 16 is a plan view schematically illustrating the piezoelectric element 400 according to the fourth embodiment. It is to be noted that FIG. 15A is a cross-sectional view cut along a line XVA-XVA in FIG. 16 and FIG. 15B is a cross-sectional view cut along a line XVB-XVB in FIG. 16. Hereinafter, in the piezoelectric element 400 according to the fourth embodiment, the same reference numerals denote members having the same functions as the components of the piezoelectric element 100 according to the first embodiment and detailed description thereof is not repeated.

As illustrated in FIGS. 15A and 15B and FIG. 16, in the piezoelectric element 400, each second electrode 40 includes a lower second electrode 440 and an upper second electrode 442.

As illustrated in FIG. 15A, the lower second electrodes 440 are formed on the first piezoelectric layers 30. The lower second electrodes 440 may be also formed on parts of the porous layers 50. The lower second electrodes 440 of the first laminated body 12 and the lower second electrode 440 of the second laminated body 14 are separated from each other. A material and thickness of the lower second electrodes 440 are selected in consideration of the adhesion property to the first piezoelectric layers 30, the diffusion property on the first piezoelectric layers 30, and the like. To be more specific, as the material of the lower second electrodes 440, for example, LNO (thickness of substantially 15 nm) can be used.

The upper second electrode 442 is formed on the lower second electrodes 440 and the insulating layers 60 and are electrically connected to the lower second electrodes 440. The upper second electrode 442 of the first laminated body 12 is electrically connected to the upper second electrode 442 of the second laminated body 14. In the example as illustrated in the drawings, the upper second electrodes 442 are integrally formed as a common electrode. The material and thickness of the upper second electrode 442 are selected in consideration of the moisture resistance (water-barrier property), the conductivity, and the like, for example. To be more specific, as the material of the upper second electrode 442, for example, iridium (thickness of substantially 50 nm) can be cited.

In the piezoelectric element 400, the porous layers 50 are formed so as to cover side surfaces 22 of the first electrodes 20 and parts of upper surfaces 24 of the first electrodes 20, which are continuous to the side surfaces 22. That is to say, the porous layers 50 cover corner portions formed by the side surfaces 22 and the upper surfaces 24.

Further, the porous layers 50 are formed so as to cover the side surfaces 32 of the first piezoelectric layers 30. As illustrated in FIG. 15A, parts of the porous layers 50 are formed between the first electrodes 20 and the lower second electrodes 440.

According to the piezoelectric element 400, the porous layers 50 cover the corner portions formed by the side surfaces 22 and the upper surfaces 24 as described above. Therefore, since the first piezoelectric layers 30 are not formed on the corner portions, even if electric fields are concentrated on the corner portions, for example, operations of the first piezoelectric layers 30 are not influenced. That is to say, the piezoelectric element 400 can suppress breakage of the piezoelectric bodies due to the concentration of the electric fields on the corner portions of the first electrodes 20. Accordingly, the piezoelectric element 400 can have high reliability.

2 Experimental Example

Hereinafter, an experimental example is illustrated and the invention is described more in detail. It is to be noted that the invention is not limited to the following experimental example.

2.1 Preparation of Sample

Silicon oxide ($SiO_2$) and zirconium oxide ($ZrO_2$) were film-formed in this order on a silicon substrate with the sputtering method so as to form a substrate. Next, iridium was sputtered with the sputtering method so as to form a first electrode. Then, PZT was formed with an MOD method and PZT was wet-etched by using a resist as a mask so as to form a porous layer and a piezoelectric body. The wet etching was performed for 2 minutes by using a 10% aqueous hydrofluoric acid solution.

2.2 SEM Observation Result

Figure 17:
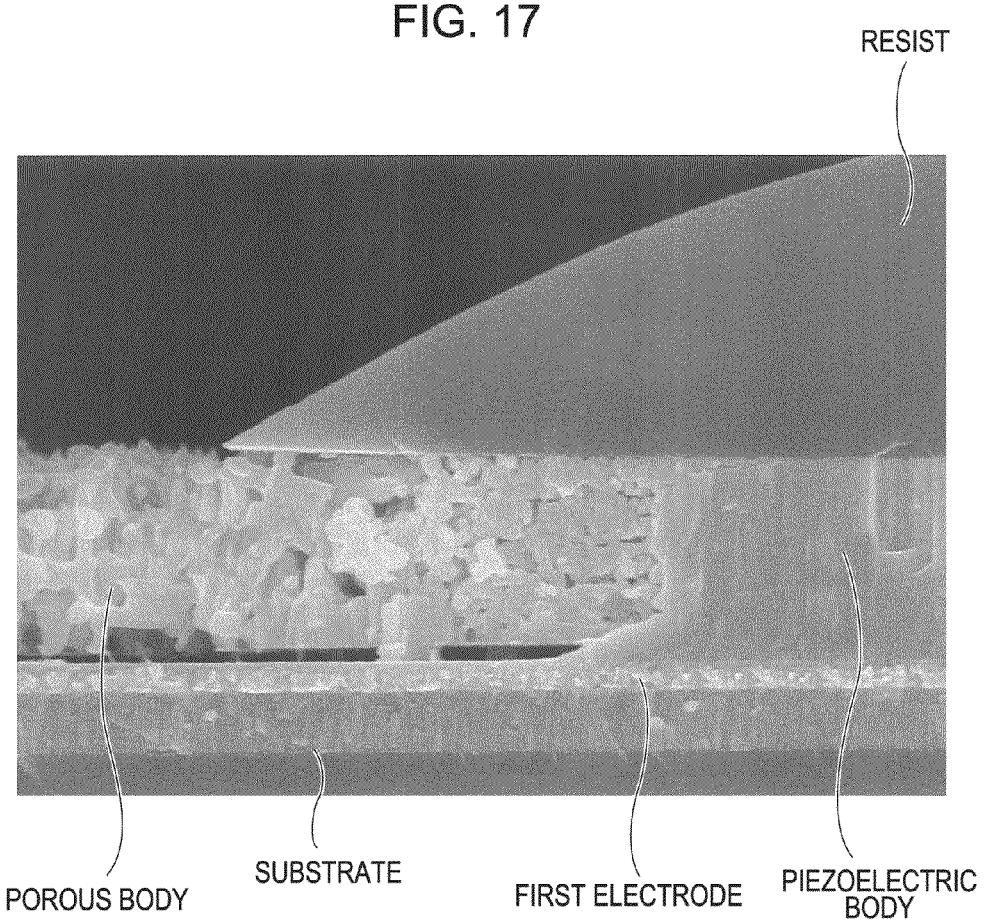
FIG. 17 illustrates an SEM observation result of an experimental example according to the embodiment.

FIG. 17 is an SEM observation result of the sample prepared in the above manner. It is observed from FIG. 17 that the density of the porous layer is smaller than that of the piezoelectric body. Further, it is found that the density of the porous layer becomes larger toward the piezoelectric body.

3 Liquid Ejecting Head

Figure 18:
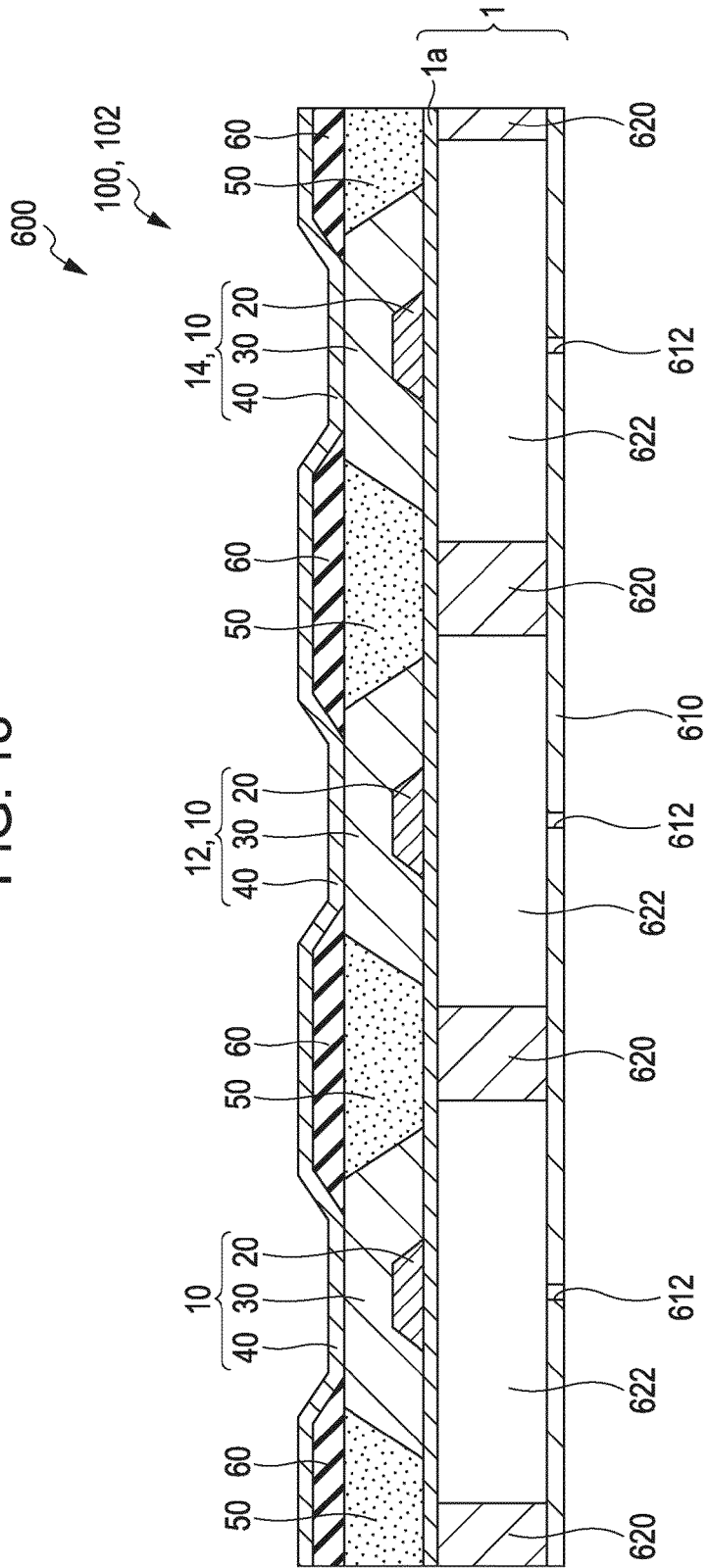
FIG. 18 is a cross-sectional view schematically illustrating a liquid ejecting head according to the embodiment.
Figure 19:
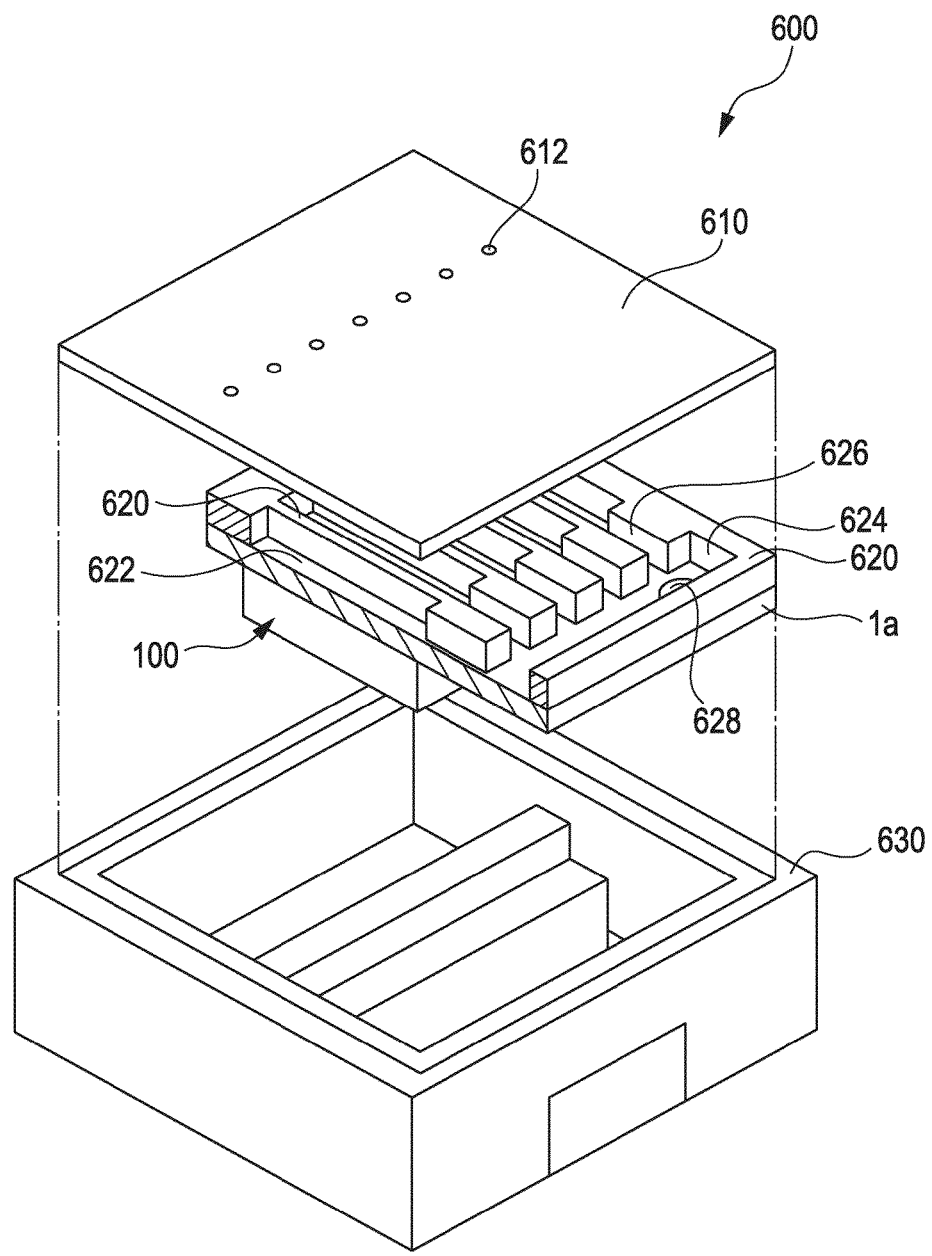
FIG. 19 is an exploded perspective view schematically illustrating the liquid ejecting head according to the embodiment.

Next, a liquid ejecting head 600 which includes the piezoelectric element (piezoelectric actuator) is described with reference to drawings as an example of applications of the piezoelectric element (piezoelectric actuator) according to the embodiment. FIG. 18 is a cross-sectional view schematically illustrating main parts of the liquid ejecting head 600 and corresponds to FIG. 1A. FIG. 19 is an exploded perspective view illustrating the liquid ejecting head 600. The liquid ejecting head 600 as illustrated in FIG. 19 is rotated upside down from a normally used state.

The liquid ejecting head 600 can have the above piezoelectric element (piezoelectric actuator). Hereinafter, the liquid ejecting head 600 in which the piezoelectric element 100 is formed on the substrate 1 (structure including a vibration plate 1a on an upper portion) and the piezoelectric element 100 and the vibration plate 1a constitute the piezoelectric actuator 102 is described as an example.

As illustrated in FIG. 18 and FIG. 19, the liquid ejecting head 600 includes a nozzle plate 610 having nozzle holes 612, a pressure chamber substrate 620 for forming pressure chambers 622, and the piezoelectric element 100. Further, as illustrated in FIG. 19, the liquid ejecting head 600 can have a housing 630. It is to be noted that in FIG. 19, the piezoelectric element 100 is illustrated in a simplified manner.

As illustrated in FIG. 18 and FIG. 19, the nozzle plate 610 has the nozzle holes 612. Ink can be discharged through the nozzle holes 612. A number of nozzle holes 612 are provided on the nozzle plate 610 in a row, for example. As a material of the nozzle plate 610, for example, silicon, stainless steel (SUS), and the like can be cited.

The pressure chamber substrate 620 is provided on the nozzle plate 610 (under the nozzle plate 610 in FIG. 19). As a material of the pressure chamber substrate 620, for example, silicon can be exemplified. The pressure chamber substrate 620 partitions a space between the nozzle plate 610 and the vibration plate 1a so that a reservoir (liquid accommodation portion) 624, supply ports 626 communicating with the reservoir 624, and pressure chambers 622 communicating with the supply ports 626 are provided. In this example, the reservoir 624, the supply ports 626, and the pressure chambers 622 are distinguished from each other and described. However, any of these components are liquid flow paths and may be designed in any ways. Further, for example, the supply ports 626 have a shape in which parts of the flow paths are made narrower in the example as illustrated in FIG. 19. However, the supply ports 626 can be arbitrarily formed in accordance with designing and are not necessary configurations. The reservoir 624, the supply ports 626 and the pressure chambers 622 are partitioned by the nozzle plate 610, the pressure chamber substrate 620, and the vibration plate 1a.

The reservoir 624 can temporarily store ink supplied from outside (for example, ink cartridge) through a through-hole 628 provided in the substrate 1. Ink in the reservoir 624 can be supplied to the pressure chambers 622 through the supply ports 626. Volumes of the pressure chambers 622 are changed by the deformation of the vibration plate 1a. The pressure chambers 622 communicate with the nozzle holes 612 and ink or the like is discharged through the nozzle holes 612 with the change of the volumes of the pressure chambers 622. It is to be noted that the reservoir 624 can be referred to as a manifold.

The piezoelectric element 100 is provided on the pressure chamber substrate 620 (under the pressure chamber substrate 620 in the example in FIG. 19). The piezoelectric element 100 is electrically connected to a piezoelectric element driving circuit (not illustrated) so as to operate (vibrate, deform) based on a signal from the piezoelectric element driving circuit. The vibration plate 1a is deformed with the operations of the first piezoelectric layers 30 so that inner pressures of the pressure chambers 622 can be appropriately changed.

In the example as illustrated in FIG. 18, the widths of the pressure chambers 622 along the short-side direction of the first electrodes 20 are larger than the widths of the first piezoelectric layers 30 along the short-side direction of the first electrodes 20. Further, parts of the porous layers 50 are located at the upper side of the pressure chambers 622. That is to say, the side surfaces of the first piezoelectric layers 30 are located at the inner side with respect to the side surfaces of the pressure chambers 622 (which can be also said as side surfaces of the pressure chamber substrate 620 partitioning the pressure chambers 622). With this, the inner pressures of the pressure chambers 622 can be effectively changed.

As illustrated in FIG. 19, the housing 630 can accommodate the nozzle plate 610, the pressure chamber substrate 620, and the piezoelectric element 100. As a material of the housing 630, for example, a resin, a metal can be mentioned.

The liquid ejecting head 600 has the above piezoelectric element 100 having high reliability. Accordingly, the liquid ejecting head 600 can have high reliability.

It is to be noted that a case in which the liquid ejecting head 600 is an ink jet recording head has been described. However, the liquid ejecting head according to the embodiment can be used as a coloring material ejecting head used for manufacturing color filters of devices such as a liquid crystal display, an electrode material ejecting head used for forming electrodes of devices such as an organic EL display and a surface emitting display (FED), a bioorganic compound ejecting head used for manufacturing biochips, and the like.

4 Liquid Ejecting Apparatus

Figure 20:
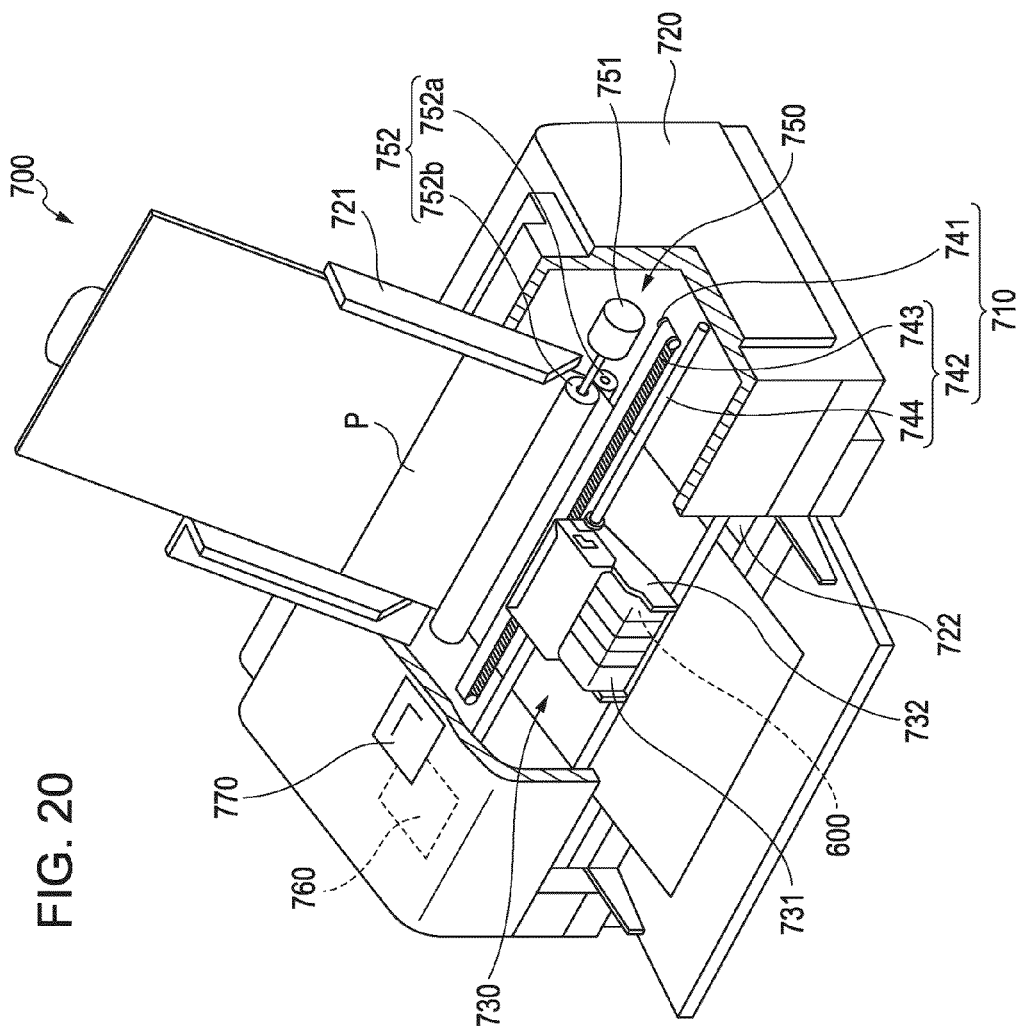
FIG. 20 is a perspective view schematically illustrating a liquid ejecting apparatus according to the embodiment.

Next, a liquid ejecting apparatus according to the embodiment is described with reference to a drawing. The liquid ejecting apparatus includes the above liquid ejecting head. Hereinafter, a case in which the liquid ejecting apparatus is an ink jet printer including the above liquid ejecting head 600 is described. FIG. 20 is a perspective view schematically illustrating a liquid ejecting apparatus 700 according to the embodiment.

As illustrated in FIG. 20, the liquid ejecting apparatus 700 includes a head unit 730, a driving unit 710, and a controller 760. The liquid ejecting apparatus 700 can further include an apparatus main body 720, a sheet feeding unit 750, a tray 721 on which a recording paper P is placed, a discharge port 722 which discharges the recording paper P, and an operation panel 770 arranged on an upper surface of the apparatus main body 720.

The head unit 730 includes an ink jet recording head (hereinafter, also simply referred to as "head") constituted by the above liquid ejecting head 600. Further, the head unit 730 includes ink cartridges 731 which supply ink to the head and a transportation unit (carriage) 732 on which the head and the ink cartridges 731 are mounted.

The driving unit 710 can reciprocate the head unit 730. The driving unit 710 includes a carriage motor 741 and a reciprocating mechanism 742. The carriage motor 741 serves as a driving source of the head unit 730 and the reciprocating mechanism 742 reciprocates the head unit 730 if the carriage motor 741 is rotated.

The reciprocating mechanism 742 includes a carriage guiding shaft 744 and a timing belt 743. Both ends of the carriage guiding shaft 744 are supported by a frame (not illustrated), and the timing belt 743 extends in parallel with the carriage guiding shaft 744. The carriage guiding shaft 744 supports the carriage 732 such that the carriage 732 can freely reciprocate. Further, the carriage 732 is fixed to a part of the timing belt 743. If the timing belt 743 travels with the operation of the carriage motor 741, the head unit 730 is guided by the carriage guiding shaft 744 and reciprocates. At the time of the reciprocation, ink is appropriately discharged from the head so that printing is performed on the recording paper P.

Note that in the embodiment, an example of the liquid ejecting apparatus which performs printing while both of the liquid ejecting head 600 and the recording paper P are moved. However, it is sufficient that the liquid ejecting apparatus according to the invention has a mechanism in which printing is performed on the recording paper P while positions of the liquid ejecting head 600 and the recording paper P are relatively changed. Further, in the embodiment, an example in which printing is performed on the recording paper P is described. However, the recording medium on which printing can be performed by the liquid ejecting apparatus according to the invention is not limited to paper and various media such as a fabric, a film, and a metal can be cited and the medium can be appropriately changed.

The controller 760 can control the head unit 730, the driving unit 710 and the sheet feeding unit 750.

The sheet feeding unit 750 can feed the recording paper P from the tray 721 to the side of the head unit 730. The sheet feeding unit 750 includes a sheet feeding motor 751 as a driving source, and a sheet feeding roller 752 which rotates with an operation of the sheet feeding motor 751. The sheet feeding roller 752 includes a driven roller 752a and a driving roller 752b which are opposed to each other in the vertical direction with respect to a feeding path of the recording paper P. The driving roller 752b is connected to the sheet feeding motor 751. If the sheet feeding unit 750 is driven by the controller 760, the recording paper P is fed so as to pass through the lower portion of the head unit 730.

The head unit 730, the driving unit 710, the controller 760 and the sheet feeding unit 750 are provided in the apparatus main body 720.

The liquid ejecting apparatus 700 includes the liquid ejecting head 600 having high reliability. Accordingly, the liquid ejecting apparatus 700 can have high reliability.

It is to be noted that the liquid ejecting apparatus 700 as described above as an example includes one liquid ejecting head 600 and printing can be performed on a recording medium with the liquid ejecting head 600. However, the liquid ejecting apparatus may include a plurality of liquid ejecting heads. When the liquid ejecting apparatus includes the plurality of liquid ejecting heads, the plurality of liquid ejecting heads may be operated independently as described above. Alternatively, in such case, the plurality of liquid ejecting heads may be connected to each other and form one assembled head. Such assembled head includes a line-type head in which a uniform space is entirely formed among nozzle holes on the plurality of heads, for example.

Hereinbefore, the liquid ejecting apparatus 700 as an ink jet printer has been described as an example of the liquid ejecting apparatus according to the invention. However, the liquid ejecting apparatus according to the invention can be also applied to a liquid ejecting apparatus for industrial use. As liquid (liquid-state material) discharged in this case, those obtained by adjusting viscosity of various functional materials to appropriate viscosity by a solvent or a disperse medium can be used. The liquid ejecting apparatus according to the invention can be preferably used as the following liquid ejecting apparatuses in addition to the image recording apparatus such as a printer as illustrated above. For example, the liquid ejecting apparatus according to the invention can be preferably used as a coloring material ejecting apparatus used for manufacturing color filters of devices such as a liquid crystal display, a liquid material ejecting apparatus used for forming electrodes or color filters of devices such as an organic EL display, a surface emitting display (FED) and an electrophoretic display, and a bioorganic compound ejecting apparatus used for manufacturing biochips.

As described above, embodiments of the invention have been described in detail. However, it would be easily understood by those skilled in the art that various variations without substantively departing from the novel scope and effects of the invention can be made. Accordingly, all of these variations are encompassed in the range of the invention.

What is claimed is:

1. A piezoelectric element comprising:
   a first electrode;
   a first piezoelectric layer which is formed at an upper side of the first electrode and at lateral sides to the first electrode;
   a porous layer which is formed so as to cover side surfaces of the first piezoelectric layer; and
   a second electrode which is formed at an upper side of the first piezoelectric layer and the porous layer,
   wherein the porous layer contains at least one metal element constituting the first piezoelectric layer, the porous layer comprising a plurality of fine holes that thereby cause the layer to be porous.

2. The piezoelectric element according to claim 1, wherein density of the porous layer becomes larger toward the first piezoelectric layer.

3. A piezoelectric actuator, comprising the piezoelectric element according to claim 2.

4. A liquid ejecting head comprising:
the piezoelectric actuator according to claim 3; and
a pressure chamber which communicates with a nozzle hole discharging liquid,
wherein a width of the pressure chamber along a short-side direction of the first electrode is larger than a width of the first piezoelectric layer along the short-side direction, and
at least a part of the porous layer is located at the upper side of the pressure chamber.

5. A liquid ejecting apparatus comprising the liquid ejecting head according to claim 4.

6. The piezoelectric element according to claim 1, further including an insulating layer formed between the porous layer and the second electrode.

7. The piezoelectric element according to claim 6,
wherein a Young's modulus of the insulating layer is smaller than a Young's modulus of the second electrode.

8. The piezoelectric element according to claim 6,
wherein side surfaces of the insulating layer are inclined with respect to an upper surface of the first piezoelectric layer.

9. A piezoelectric actuator, comprising the piezoelectric element according to claim 3.

10. A liquid ejecting head comprising:
the piezoelectric actuator according to claim 9; and
a pressure chamber which communicates with a nozzle hole discharging liquid,
wherein a width of the pressure chamber along a short-side direction of the first electrode is larger than a width of the first piezoelectric layer along the short-side direction, and
at least a part of the porous layer is located at the upper side of the pressure chamber.

11. The piezoelectric element according to claim 1, further including a second piezoelectric layer which is formed between the first piezoelectric layer and the porous layer, and the second electrode.

12. The piezoelectric element according to claim 11,
wherein a material of the second piezoelectric layer is the same as a material of the first piezoelectric layer.

13. The piezoelectric element according to claim 1, further including a third piezoelectric layer at the lower side of the porous layer.

14. The piezoelectric element according to claim 13,
wherein a material of the third piezoelectric layer is the same as the material of the first piezoelectric layer.

15. The piezoelectric element according to claim 1,
wherein the first electrode, the first piezoelectric layer and the second electrode form a laminated body,
a plurality of laminated bodies are provided,
the plurality of laminated bodies are arranged in line along a short-side direction of the first electrodes,
the first electrodes are individual electrodes on the plurality of laminated bodies,
the second electrode is a common electrode to the plurality of laminated bodies, and
the porous layer is formed between the plurality of laminated bodies.

16. The piezoelectric element according to claim 1,
wherein a material of the first piezoelectric layer is lead zirconate titanate.

17. A piezoelectric actuator, comprising the piezoelectric element according to claim 1.

18. A liquid ejecting head comprising:
the piezoelectric actuator according to claim 17; and
a pressure chamber which communicates with a nozzle hole discharging liquid,
wherein a width of the pressure chamber along a short-side direction of the first electrode is larger than a width of the first piezoelectric layer along the short-side direction, and
at least a part of the porous layer is located at the upper side of the pressure chamber.

19. A liquid ejecting apparatus comprising the liquid ejecting head according to claim 18.

* * * * *